United States Patent
Klug, Jr.

(10) Patent No.: US 9,374,076 B2
(45) Date of Patent: Jun. 21, 2016

(54) SOLID STATE RELAY CIRCUIT

(75) Inventor: Robert R. Klug, Jr., Fredericksburg, VA (US)

(73) Assignee: McQ Inc., Fredericksburg, VA (US)

( * ) Notice: Subject to any disclaimer, the term of this patent is extended or adjusted under 35 U.S.C. 154(b) by 924 days.

(21) Appl. No.: 13/413,424

(22) Filed: Mar. 6, 2012

(65) Prior Publication Data

US 2013/0234779 A1 Sep. 12, 2013

(51) Int. Cl.
*H01H 47/00* (2006.01)
*H03K 17/0412* (2006.01)
*H03K 17/78* (2006.01)

(52) U.S. Cl.
CPC .......... *H03K 17/04123* (2013.01); *H03K 17/78* (2013.01); *H03K 2217/0081* (2013.01)

(58) Field of Classification Search
CPC ....................................................... H01H 47/00
USPC ........................................................ 307/126
See application file for complete search history.

(56) References Cited

U.S. PATENT DOCUMENTS

| | | | |
|---|---|---|---|
| 4,419,586 A | 12/1983 | Phipps | |
| 4,431,871 A | 2/1984 | Gupta | |
| 4,438,356 A | 3/1984 | Fleischer | |
| 4,492,883 A | 1/1985 | Janutka | |
| 4,500,801 A | 2/1985 | Janutka | |
| 4,564,770 A | 1/1986 | Sherman et al. | |
| 4,647,794 A * | 3/1987 | Guajardo | H03K 5/1515 250/551 |
| 4,649,302 A * | 3/1987 | Damiano | H03K 17/6874 323/351 |
| 4,680,490 A | 7/1987 | Baker et al. | |
| 4,859,875 A | 8/1989 | Tihanyi et al. | |
| 4,864,126 A | 9/1989 | Walters et al. | |
| 4,902,901 A | 2/1990 | Pernyeszi | |
| 5,360,979 A * | 11/1994 | Joseph | H03K 17/04123 250/551 |
| 5,536,980 A * | 7/1996 | Kawate | H01H 9/547 307/116 |
| 6,335,538 B1 * | 1/2002 | Prutchi | H03K 17/785 250/551 |
| 6,555,935 B1 * | 4/2003 | Maskovyak | H03K 17/04123 307/117 |
| 6,806,482 B2 * | 10/2004 | Yamagishi | H01L 31/125 250/551 |
| 7,196,435 B2 * | 3/2007 | Kugelman | H03K 17/133 307/141.8 |
| 2009/0289691 A1 | 11/2009 | Fuller et al. | |

OTHER PUBLICATIONS

Vishay, "Dual Photovoltaic MOSFET Driver Solid State Relay", Document No. 84639, Rev. 1.6, May 7, 2008, 7 pages.
Vishay, "SSR Design Using VO1263", Document No. 81225, Revision 1.0, Feb. 8, 2007, pp. 1-9.
Dapkus II, International IOR Rectifier Design Tips, "Using Mos-Gated Power Transistor in AC Switch Applications", Sep. 2, 2011, 2 pages.
International IOR Rectifier, "The PVI—a New Versatile Circuit Element", Jan. 11, 2007, AN-1017 Rev. B, 6 pages.

\* cited by examiner

*Primary Examiner* — Rexford Barnie
*Assistant Examiner* — Joseph Inge
(74) *Attorney, Agent, or Firm* — Fiala & Weaver P.L.L.C.

(57) ABSTRACT

A solid state relay and method for enabling and disabling power to a load are disclosed. A fast turn-on circuit and fast turn-off circuit receive control signals in an isolated manner. The control signals allow only one of the fast turn-on circuit and fast turn-off circuit to be enabled at a time. A power switching circuit that enables power to be supplied to a load when the fast turn-on circuit is enabled and the fast turn-off circuit is disabled state, and disables the power from being supplied to the load when the fast turn-on circuit is disabled and the fast turn-off circuit is enabled. A power supply circuit provides isolated power used by the fast turn-on and fast turn-off circuits to drive or discharge a gate in the power switching circuit.

19 Claims, 15 Drawing Sheets

1200

1202 — receive first control signal at third opto-isolator and receive second control signal at a fourth opto-isolator in fast turn-off circuit 1204 — enable third opto-isolator in response to first control signal and disable fourth opto-isolator in response to second control signal 1206 — couple gate of NMOS to first isolated power supply at node A through third opto-isolator to enable NMOS 1208 — couple first power supply to gate of power transistor in power switching circuit through PMOS 1210 — couple gate of switch in power switching circuit 110 at node A' to an emitter of switch at common node C to quickly discharge gate of switch and disable switch 1212 — disconnect source power from load 1214 — maintain source power to load in "OFF" state

FIG. 12

SOLID STATE RELAY CIRCUIT

STATEMENT REGARDING FEDERALLY SPONSORED RESEARCH OR DEVELOPMENT

This invention was made with government support under Contract No. N00167-11-P-0134 awarded by the United States Naval Sea Systems Command Small Business Innovation Research (SBIR) Program. The government may have certain rights in the invention.

BACKGROUND OF THE INVENTION

1. Field of the Invention

The present invention relates to the switching of power to a load, and more particularly, to solid state relays and methods for switching power to a load very quickly.

2. Background Art

Relays are electrically controlled switching devices. Electromechanical relays provide switching with a mechanical device typically controlled by an electromagnet. Solid state relays use semiconductors to provide switching. Solid state relays are frequently used to control a power supply to a load. Typically, a low voltage control signal is applied to a semiconductor switch to enable or disable a higher voltage power supply. Because the solid state relay controls a high voltage, high current power supply to a load, electrical isolation between the control circuitry and the load power is required. Transformers may be used to provide isolation between the low power circuitry and the high power circuitry in solid state relays. However, transformers should not be used in high shock environments, where there is a potential for mechanical shock or vibration. Photodiode opto-isolators may be used to control gates in a power switching stage; however, photodiode opto-isolators provide very little power and take a long time to charge the gates to switch the power supply. Alternatively, in order to generate a high enough voltage to enable a semiconductor switch, many photodiodes may be stacked in series.

TRIAC (TRIode for Alternating Current) or SCR (silicon controlled rectifier) based solid state relays remain on until the load current drops below a certain threshold, which occurs every ½ cycle in an AC powered system. Thus, TRIAC and SCR based solid state relays have a maximum turn off time of a ½ cycle, which may be more than 8 ms (milliseconds) at 60 Hz, to disconnect power to a load. In addition to the ½ cycle maximum turn-off time, TRIAC and SCR based solid state relays can have issues when powering a low power factor load. With a low power factor load, the solid state relays will attempt to turn off when the current approaches zero, which will cause a fast voltage transient (dv/dt) because the voltage will not be at zero volts. This can cause the solid state relays to latch up into the on-state. A snubber circuit can be used to slow down this voltage transient to minimize this issue.

BRIEF SUMMARY OF THE INVENTION

Methods, systems, and apparatuses for performing a fast turn-on and a fast turn-off of a power supply to a load are provided. A solid state relay circuit is configured to control a power supply to a load using low voltage control signals and low-isolated input power. A fast turn-on circuit and a fast turn-off circuit are configured to enable the low voltage control signals to quickly enable and disable the power supply to the load.

In an example aspect, a solid state relay circuit is provided. The solid state relay circuit includes a fast turn-on circuit, a fast turn-off circuit, a power switching circuit, and a power supply circuit. The fast turn-on circuit and the fast turn-off circuit receive first and second control signals in an isolated manner. The fast turn-on circuit operates in an enabled state when the first and second control signals have first values, and switches to a disabled state when the first and second control signals have second values. The fast turn-off circuit operates in a disabled state when the first and second control signals have the first values, and switches to an enabled state when the first and second control signals have the second values. The power switching circuit enables an output power to be supplied to a load when the fast turn-on circuit is in the enabled state and the fast turn-off circuit is in the disabled state, and disables the output power from being supplied to the load when the fast turn-on circuit is in the disabled state and the fast turn-off circuit is in the enabled state. The power supply circuit provides isolated power to the fast turn-on circuit and the fast turn-off circuit and drives the power switching circuit to couple the power supply to the load when the fast turn-on circuit is in the enabled state and the fast turn-off circuit is in the disabled state and to disable the power supply to the load when the fast turn-on circuit is in the disabled state and the fast turn-off circuit is in the enabled state.

These and other objects, advantages, and features will become readily apparent in view of the following detailed description of the invention. Note that the Summary and Abstract sections may set forth one or more embodiments, but not all exemplary embodiments of the present invention as contemplated by the inventor(s).

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 12 shows a flowchart for enabling a fast turn-off circuit, according to an example embodiment.

Figure 1:
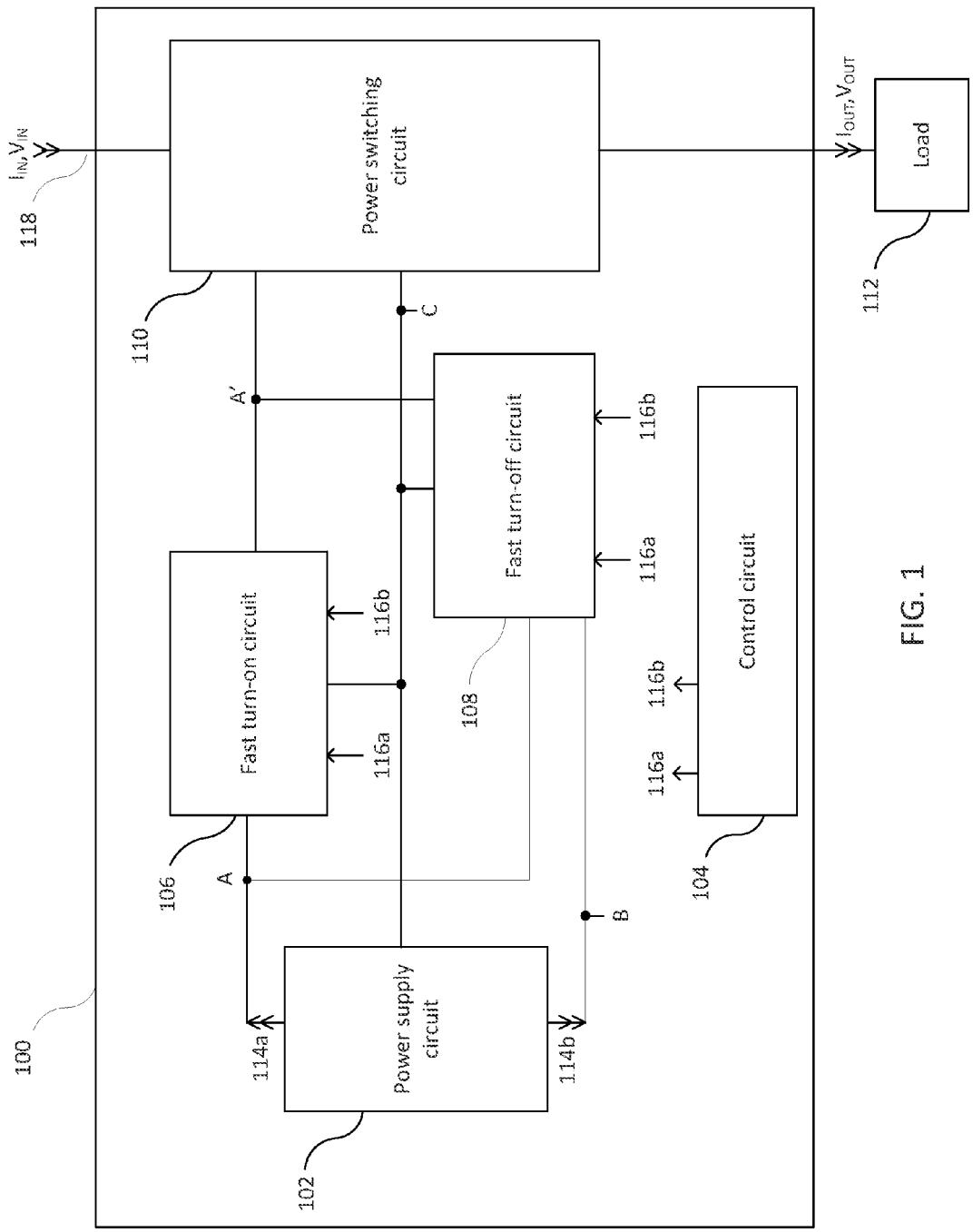
FIG. 1 shows a block diagram of a solid state relay according to example embodiments.

The present invention will now be described with reference to the accompanying drawings. In the drawings, like reference numbers indicate identical or functionally similar elements throughout. Additionally, the left-most digit(s) of a reference number identifies the drawing in which the reference number first appears.

DETAILED DESCRIPTION OF THE INVENTION

Introduction

The present specification discloses one or more embodiments that incorporate the features of the invention. The disclosed embodiment(s) merely exemplify the invention. The scope of the invention is not limited to the disclosed embodiment(s). The invention is defined by the claims appended hereto.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

Example Embodiments

The example embodiments described herein are provided for illustrative purposes, and are not limiting. In embodiments, a solid state relay for providing fast switching is provided. Different circuit configurations may be used, including using voltage controlled devices such as MOSFETs or other types of field effect transistors (FETs), IGBTs (insulated gate bipolar transistors), and/or optical isolation. The example embodiments described herein may be adapted to any type of semiconductor technology. Further structural and operational embodiments, including modifications/alterations, will become apparent to persons skilled in the relevant art(s) from the teachings herein.

A solid state relay as disclosed herein provides very fast power switching speeds using solid state electronics while being robust enough to handle voltage transients and inrush currents, such as may occur in otherwise normal operations, even in the event of severe mechanical shock or vibrations. In an embodiment, the solid state relay provides fast switching for high voltage, high power AC (alternating current) or DC (direct current) loads, and uses optical coupling of low voltage signals for both operating power and control inputs. For instance, in one implementation, switching can occur in less than a ¼ cycle of a 400 kHz waveform (e.g., for a switch off time of 10 μsec). That is, in embodiments, fast turn-off can occur in under 10 microseconds, and fast turn-on can be performed even faster. Transition times of less than one microsecond can be attained, in embodiments. High voltage capacitive and inductive loads have a tendency to overpower, especially during transient periods, which can cause damage to themselves and circuits coupled thereto. Therefore, transition speed is important in order to minimize power dissipation across power transistors in high power applications.

Embodiments for providing fast switching of a power supply to a load may be implemented in a variety of environments. For instance, FIG. 1 shows a block diagram of a solid state relay 100, according to example embodiments. Solid state relay 100 is a solid state device used to switch power to a load. Solid state relay 100 enables a fast turn-on and a fast turn-off of a power supply to a load. As shown in FIG. 1, solid state relay 100 includes a power supply circuit 102, a control circuit 104, a fast-turn on circuit 106, a fast turn-off circuit 108 and a power switching circuit 110 coupled to a load 112. Solid state relay 100 receives a source power 118 (also labeled as current $I_{IN}$, and voltage $V_{IN}$) at an input to power switching circuit 110 that is provided to power load 112. Solid state relay 100 either enables source power 118 to be supplied to load 112 or disables source power 118 from being supplied to load 112. Source power 118 may be a high voltage and/or high current AC or DC power supply. Solid state relay 100 uses low voltage control signals to control high voltage source power 118, and uses relatively small, optically isolated power supplies to drive high voltage circuitry that causes source power 118 to be switched.

The elements of solid state relay 100, with the exception of control circuit 104 and isolated portions not shown in FIG. 1, are coupled to a common node C, which "floats" at a reference voltage level of source power 118. This reference voltage at common node C may be considered as a floating ground. Thus, high voltage elements of solid state relay 100 may be floating at a 220V or 440V AC or DC reference voltage, for example. Because some of the circuitry of solid state relay 100 is referenced to a high voltage of supply power 118, the low voltage control signals and low voltage power supplies are electrically isolated from the high power components. Solid state relay 100, however, does not use transformers or inductors to provide the electrical isolation as are commonly found in solid state relays. For example, solid state relay 100 may use optical isolation for both the control signals and the operating power, as is described more fully herein below. In such case, the solid state relay circuit is also shock resistant. Alternatively, magnetic isolation or other forms of isolation may be used. The elements of solid state relay shown in FIG. 1 work together to allow very fast switching of the source power to the load. The elements of solid state relay 100 are described as follows.

As shown in FIG. 1, power supply circuit 102 is a circuit for generating and supplying small optically isolated power supplies to provide operating power to elements of solid state relay 100, and to drive high-voltage gate circuitry of power switching circuit 110. Power supply circuit 102 generates first and second isolated power supply voltages 114a and 114b used to power fast turn-on circuit 106 and fast turn-off circuit 108, and to drive or disable a switch in power switching circuit 110. Power supply circuit 102 outputs first isolated power supply voltage 114a at a node A and outputs second isolated power supply voltage 114b at a node B. Power supply circuit 102 is coupled to common node C, and therefore floats at a reference voltage of source power 118. Power supply circuit 102 receives isolated input to generate first and second isolated power supply voltages 114a and 114b. This and other aspects of power supply circuit 102 are described in greater detail with respect to FIGS. 2 and 3 further below.

Control circuit 104 is a low voltage, low power circuit that generates low voltage control signals that control elements of solid state relay 100 to enable and disable a supply of source power 118 to load 112. Control circuit 104 generates first and second control signals 116a and 116b and supplies control signals 116a and 116b to fast turn-on circuit 106 and fast turn-off circuit 108. First and second control signals 116a and 116b are configured to enable and disable fast turn-on circuit 106 and fast turn-off circuit 108 depending on a logic level (also referred to herein as a "value") of the control signals. Fast turn-on circuit 106 and fast turn-off circuit 108 and first and second control signals 116a and 116b are configured so that only one of fast turn-on circuit 106 and fast turn-off circuit 108 is enabled at a time. As shown in FIG. 1, control circuit 104 is not electrically coupled to common node C or any other node of solid state relay 100. Because source power 118 may be a high voltage and/or high current power supply, control circuit 104 is electrically isolated from source power 118 and other high voltage components of solid state relay 100 to protect low power circuitry of control circuit 104. Control circuit 104 generates and provides first and second control signals 116a and 116b to fast turn-on circuit 106 and fast turn-off circuit 108 independently of any high voltage circuitry of solid state relay 100. A manner in which first and second control signals are applied to fast turn-on circuit 106 and fast turn-off circuit 108 is described more fully with respect to FIGS. 5 and 6. Control circuit 104 is described in greater detail with respect to FIG. 4 further below.

Fast turn-on circuit 106 is a circuit for enabling a fast turn-on of the source power supply 118 to load 112. Fast turn-on circuit 106 drives power switching circuit 110 to enable the supply of source power to load 112 when fast turn-on circuit 106 is operating in an enabled state. Fast turn-on circuit 106 has an input coupled to node A and an output coupled to a node A'. Fast turn-on circuit 106 is also coupled to common node C and thus floats at the reference voltage of power supply 118. Fast turn-on circuit 106 receives first isolated power supply voltage 114a from power supply circuit 102 at node A, and receives first and second control signals 116a and 116b in an isolated manner from control circuit 104. First isolated power supply voltage 114a provides an operating power for fast turn-on circuit 106. First and second control signals 116a, 116b either enable or disable fast turn-on circuit 106 depending on their values. When enabled, fast turn-on circuit 106 drives first isolated power supply voltage 114a to power switching circuit 110 by providing first isolated power supply voltage 114a on node A'. First isolated power supply voltage 114a enables power switching circuit 110 to supply source power 118 to load 112. Fast turn-on circuit 106 is described in greater detail with respect to FIG. 5 further below.

Fast turn-off circuit 108 is a circuit for enabling a fast turn-off of source power 118 to load 112. Fast turn-off circuit 108 actively disables power switching circuit 110 from supplying source power 118 to load 112 when fast turn-off circuit 108 is operating in an enabled state. Fast turn-off circuit 108 has an input coupled to node A' and an output coupled to common node C. Fast turn-off circuit 108 receives first and second control signals 116a and 116b in an isolated manner from control circuit 104. First and second control signals 116a and 116b either enable or disable fast turn-off circuit 108 depending on their values. Fast turn-off circuit 108 receives first isolated power supply voltage 114a from power supply circuit 102 at node A and receives second isolated power supply voltage 114b from power supply circuit 102 at node B. First isolated power supply voltage 114a provides operating power for fast turn-off circuit 108 when fast turn-off circuit 108 is operating in an enabled state, and second isolated power supply voltage 114b provides operating power for fast turn-off circuit 108 when fast turn-off circuit 108 is operating in a disabled state. Fast turn-off circuit 108 is described in greater detail with respect to FIG. 6 further below.

Power switching circuit 110 includes a switch that when closed (conducting), enables source power 118 input thereto ($I_{IN}$, $V_{IN}$) to be supplied to load 112 by conducting source power 118 ($I_{OUT}$, $V_{OUT}$) to load 112, and when open, disables source power 118 from being supplied to load 112 by not conducting source power 118. Power switching circuit 110 "floats" at a reference voltage level of the source power 118 input thereto. Power switching circuit 110 is coupled to power supply circuit 102, fast turn-on circuit 106 and fast turn-off circuit 108 at common node C, which floats at the reference voltage of source power 118. Power switching circuit 110 has an input coupled to node A'. When fast turn-on circuit 104 is operating in an enabled state and fast turn-off circuit 108 is operating in a disabled state, power switching circuit 110 receives first isolated power supply voltage 114a from fast turn-on circuit 104 at node A' that drives power switching circuit to supply source power 118 to load 112. When fast turn-off circuit 106 is operating in an enabled state and fast turn-on circuit 104 is operating in a disabled state, fast turn-off circuit 106 at node A' actively disables power switching circuit from supplying source power 118 to load 112. Power switching circuit 110 is described in greater detail with respect to FIGS. 7A and 7B further below.

As noted above, in an embodiment, solid state relay 100 provides fast switching in a fully optically isolated design without the use of transformers or inductors. The elements of solid state relay 100 in FIG. 1 may be implemented in various ways. Implementations of elements of solid state relay 100 of FIG. 1 are described below in greater detail with respect to FIGS. 2-7, which show elements of solid state relay according to various example embodiments. It should be noted that nodes A, A', B and C shown throughout FIGS. 2-7 are the same nodes A, A', B and C of solid state relay 100 shown in FIG. 1. Elements of the circuits shown in FIGS. 2-7 that are connected to any of nodes A, A', B and C may be considered as being connected to other elements of FIGS. 2-7 that are also connected to those nodes, except where otherwise noted. It should further be noted that like reference characters refer to like elements throughout.

Power Supply Circuitry

Figure 2:
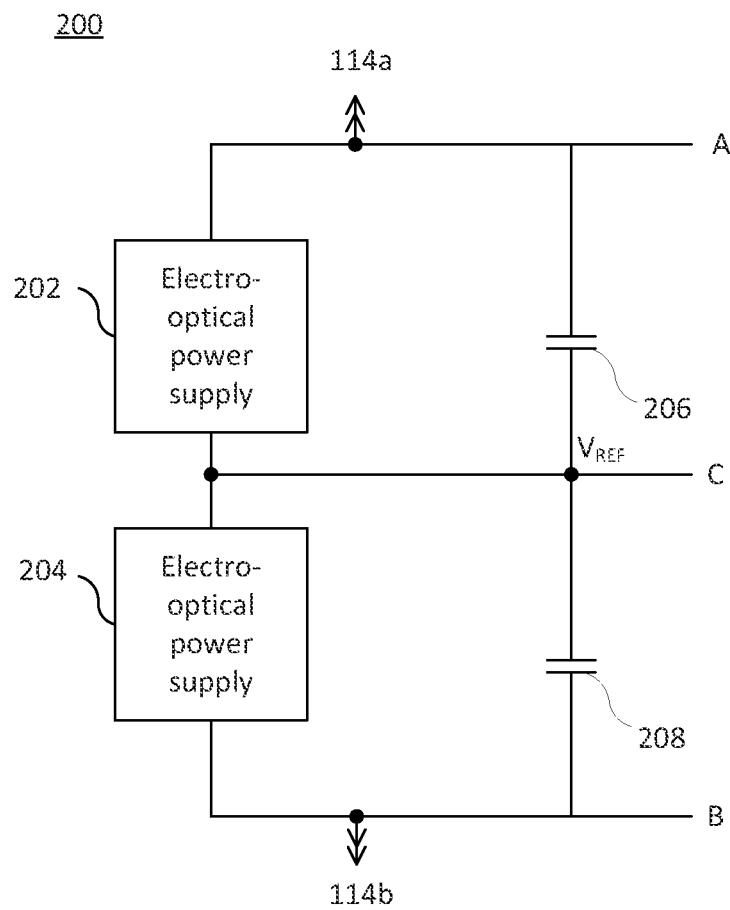
FIG. 2 shows an example of an isolating power supply circuit according to an example embodiment.
Figure 3:
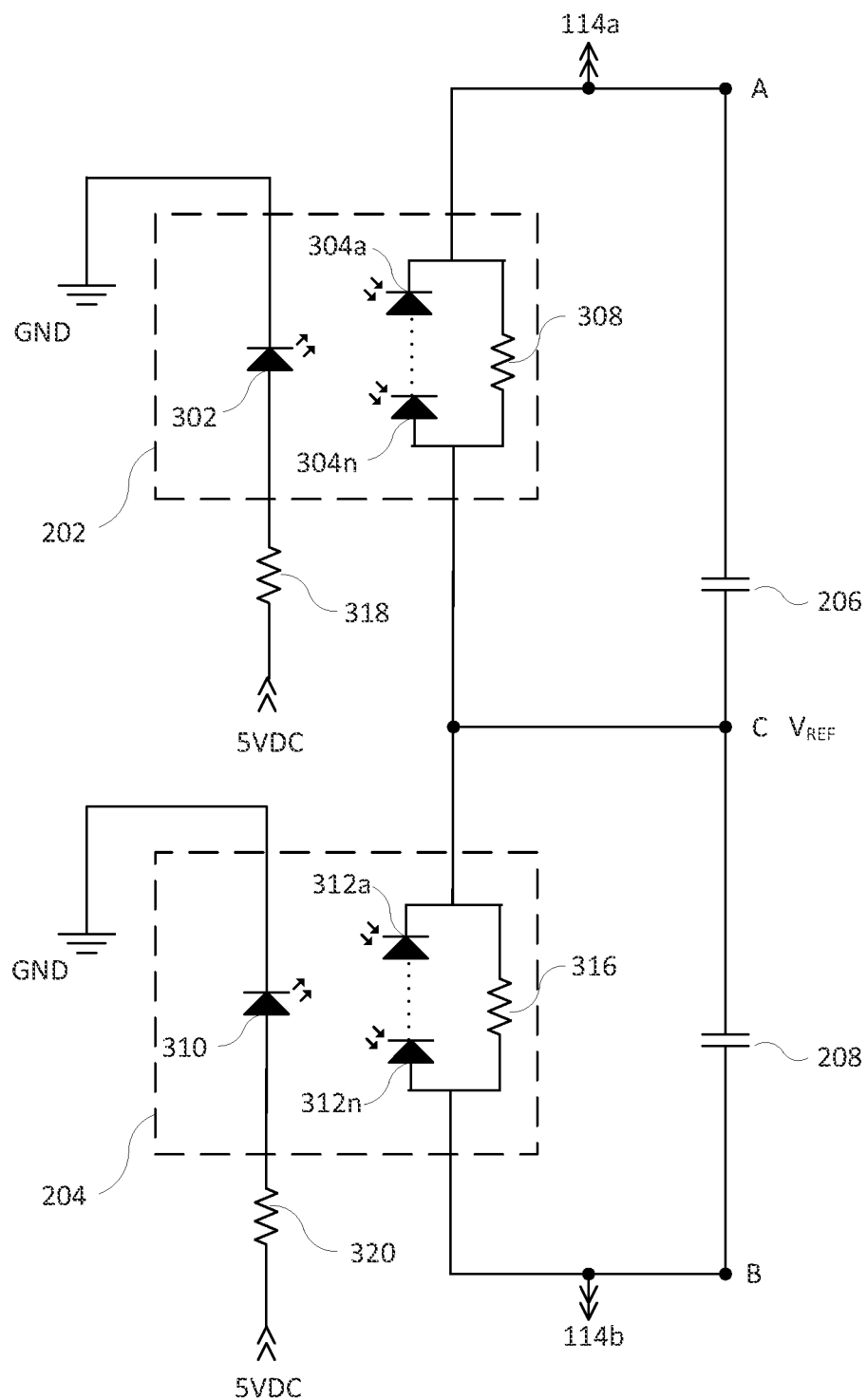
FIG. 3 shows examples of electro-optical power supplies shown in FIG. 2 according to an example embodiment.

FIGS. 2 and 3 show examples of a power supply circuit 200, according to embodiments. In some embodiments, power supply circuit 102 of solid state relay 100 shown in FIG. 1 may be implemented in a similar manner as power supply circuit 200 shown in FIGS. 2 and 3. Note that power supply circuit 200 is provided for purposes of illustration, and is not intended to be limiting. In further embodiments, power supply circuit 102 may be implemented in other ways, as would be known to persons skilled in the relevant art(s). The examples of power supply circuit 200 shown in FIGS. 2 and 3 are described as follows.

In an embodiment, power supply circuit 200 includes physically small electrically isolated power supplies that do not include transformers or inductors. Power supply circuit 200 generates optically isolated power signals that power solid state relay 100 and drive high voltage circuitry in power switching circuit 110. Power supply circuit 200 includes first and second electro-optical power supplies 202 and 204 and first and second capacitors 206 and 208. First electro-optical power supply 202 is coupled at a first terminal to node A and capacitor 206, and at a second terminal to common node C. Second electro-optical power supply 204 is coupled at a first terminal to common node C and at a second terminal to node B and capacitor 208. First capacitor 206 is coupled between node A and node C, and second capacitor 208 is coupled between node C and node B.

First electro-optical power supply 202 generates a first voltage at node A relative to node C. First storage capacitor 206 stores positive charge from the first voltage on a positive plate thereof at node A. In an embodiment, second electro-optical power supply 204 generates a second voltage at node B that is lower in voltage relative to the first voltage. Second storage capacitor 208 stores negative charge from the second voltage on a negative plate thereof at node B. Because first electro-optical power supply 202, first capacitor 206, second electro-optical power supply 204, and second capacitor are coupled together at common node C, the first voltage is greater than the reference voltage at common node C by an amount that is substantially the same as an amount by which second voltage is lower than the reference voltage at common node C. For example, if reference voltage is 0V, then first electro-optical power supply 202 generates the first voltage as a voltage V+ and second electro-optical power supply 204 generates the second voltage as a voltage V− of a same magnitude and opposite polarity with respect to the first voltage. When power supply circuit 200 is used in solid state relay 100 as power supply circuit 102, first and second voltages generated by first and second electro-optical power supplies are first and second isolated power supply voltages 114a and 114b of FIG. 1.

Because current does not flow through capacitors, capacitors 206 and 208 also serve to decouple electro-optical power supplies 202 and 204 from common node C, which follows a reference voltage of source power 118. Storage capacitors 206 and 208 are used with electro-optical power supplies 202 and 204 to store charge and provide surge current required for fast switching of a power supply to a load and quiescent current to maintain a power supply to a load in an on or off state. The surge current is used to quickly charge the gates of power transistors, as is described later with respect to FIGS. 5 and 6.

The energy output by electro-optical power supplies 202 and 204 is electrically isolated from its source. Isolation is used to protect components and signal integrity from high voltage source power. Optical isolation is also useful for breaking ground loops caused by return current in ground wires. The solid state relay disclosed herein provides electrical isolation allowing the relay to control AC power using a control signal relative to the AC power voltage. Furthermore, the solid state relay disclosed herein provides electrical isolation without the use of transformers or inductors. Thus, a solid state relay as disclosed is capable of operating to switch a load very quickly even in the event of a mechanical shock. Electro-optical power supplies for achieving electrically isolated power according to an example embodiment are now described with respect to FIG. 3.

FIG. 3 shows power supply circuit 200 with exemplary first and second electro-optical power supplies 202 and 204, according to an embodiment. Note that power supply circuit 200 having exemplary first and second electro-optical power supplies 202 and 204 is provided for purposes of illustration, and is not intended to be limiting. Power supply circuit 200 having exemplary first and second electro-optical power supplies 202 and 204 shown in FIG. 3 is described as follows. It should be noted that like elements of power supply circuit 200 described with reference to FIG. 2 are the same in FIG. 3 and the descriptions thereof may not be repeated here for purposes of brevity.

First electro-optical power supply 202 includes a light emitting diode (LED) 302 and photodiodes 304a-304n with a parallel resistor 308. Photodiodes 304a-304n may include any number of photodiodes (as indicated by dotted lines in FIG. 3). LED 302 is optically coupled with photodiodes 304a-304n. An anode of LED 302 is coupled to a 5V DC (or other voltage) power supply through a resistor 318, and a cathode of LED 302 is coupled to a ground signal (e.g., non-isolated ground). A cathode of photodiode 304a is coupled to node A, and an anode of photodiode 304n is coupled to common node C. Otherwise, photodiodes 304a-304n are coupled in series anode to cathode. LED 302 converts energy from the 5V power supply into light, which impinges upon photodiodes 304a-304n. Photodiodes 304a-304n convert the received light into a small voltage and current, which is increased by the series connection of photodiodes 304a-304n. First electro-optical power supply 202 outputs this voltage and current as a first isolated power supply, e.g., first isolated power supply voltage 114a. First storage capacitor 206 stores charge from this voltage.

Second electro-optical power supply 204 is configured similarly to first electro-optical power supply 202, having a second LED 310, and series connected photodiodes 312a-312n and a parallel resistor 316. Photodiodes 312a-312n may include any number of photodiodes (as indicated by dotted lines in FIG. 3). An anode of LED 310 is connected to a 5V DC (or other voltage) power supply through resistor 320, and a cathode of LED 310 is coupled to the ground signal (e.g., non-isolated ground). A cathode of photodiode 312a is coupled to common node C, and an anode of photodiode 312n is coupled to node B. Otherwise, photodiodes 312a-312n are coupled in series, anode to cathode. LED 310 converts energy from the 5V power supply into light, which impinges upon photodiodes 312a-312n. Photodiodes 312a-312n convert the light into a small voltage and current, which is increased by the series connection of photodiodes 312a-312n. Second electro-optical power supply 204 outputs this voltage and current as a second isolated power supply, e.g., second isolated power supply voltage 114b. Second storage capacitor 208 stores negative charge from this voltage on its negative plate at node B. The output across electro-optical power supplies 202 and 204 (e.g., the voltage between first and second isolated power supply voltages 114a and 114b) is the sum of their respective output voltages.

Control Circuitry

As noted above, control circuit 104 is a low voltage, low power circuit that generates low voltage control signals that control elements of solid state relay 100 to enable and disable a supply of source power 118 to load 112. Control circuit 104 receives as input a logical high or logical low level master control signal and outputs control signals having logical high or logical low levels. The control signals output by control circuit 104 may be referred to as "first and second" control signals, even though more than two control signals may actually be output depending on the embodiment. As referred to herein, a "first control signal" means all control signals output by control circuit 104 that for a given master control signal have a logical level of the master control signal and a "second control signal" means all control signals output by control circuit 104 for the same master control signal that have a logical level opposite that of the first control signal.

A master control signal input to a control circuit as disclosed herein represents a decision as to whether or not power, such as source power 118 of FIG. 1, should be supplied to a load, such as load 112 of FIG. 1. When a decision is made to allow a source power to be supplied to a load, a master control signal may have a first logical level. When a decision is made to interrupt the power supply to the load, the master control signal may be toggled to a second logical level opposite the first. A decision to perform this fast turn-on or fast turn-off of power supply to a load may be made by a computer, a decision circuit, an embedded system, a microcontroller, an ASIC, a human, or by any other means, known or as yet unknown. The decision may be made based on any number of factors. For example, a circuit or computer may monitor for any number of conditions, such as excess current in part of the circuit or load, a ground fault in which current flows through a neutral line, or any other condition which may be cause to interrupt or enable a power supply to a load. As another example, a human or computer program may monitor for unauthorized or unusual activity in a virtual or physical environment and determine cause to perform a fast shut down of an information system, a building, machinery, etc. An explosion or collision may cause vibrations that are sensed and generate a decision to perform a fast shut-down of any device switched by a solid state relay disclosed herein. These examples are for illustrative purposes only and are not meant to be limiting. Embodiments receive an input that is representative of a decision, and use the input to perform a fast turn-on or a fast turn-off of a supply of power to a load.

Figure 4:
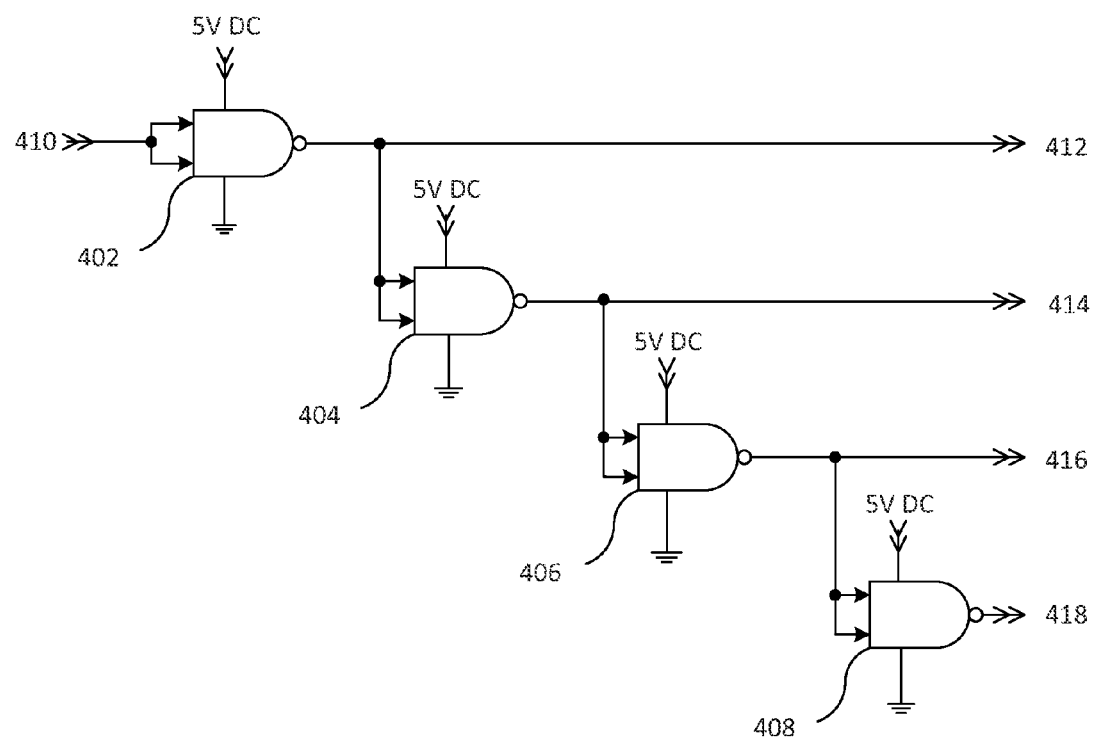
FIG. 4 shows an example of a control circuit according to an example embodiment.

A circuit for receiving a master control signal as input and generating control signals as output in response to receiving the master control signal may be implemented in many ways. For instance, FIG. 4 shows a control circuit 400 according to an example embodiment. In some embodiments, control circuit 104 of solid state relay 100 shown in FIG. 1 may be implemented in a similar manner as control circuit 400 shown in FIG. 4. Note that control circuit 400 is provided for purposes of illustration, and is not intended to be limiting. In further embodiments, control circuit 400 may be implemented in other ways, as would be known to persons skilled in the relevant art(s). Control circuit 400 shown in FIG. 4 is described as follows.

Control circuit 400 generates control signals in electrical isolation from other elements of solid state relay 100. Control signals output by control circuit 400 are received by fast turn-on circuit 106 and fast turn-off circuit 108 in an isolated manner, as is described more fully with respect to FIGS. 5 and 6. Control circuit 400 receives a master control signal 410 and generates first through fourth control signals 412, 414, 416 and 418. First through fourth control signals 412, 414, 416 and 418 are influenced by master control signal 410. When a decision is made to perform a fast turn-off of a source power (such as source power 118 of FIG. 1) being supplied to a load (such as load 112 of FIG. 1), a logical level of master control signal 410 input to control circuit 400 is toggled, which in turn toggles control signals generated and output by control circuit 400. Likewise, when a decision is made to perform a fast turn-on of a source power to a load, a logical level of master control signal 410 is again toggled, which in turn toggles each of first through fourth control signals 412, 414, 416 and 418. Master control signal 410 may be input to control circuit 400 by toggling a switch. Such a switch may be a manual switch or may be controlled using a microcontroller, an ASIC, or any number of analog or digital circuits.

As shown in FIG. 4, control circuit 400 includes first-fourth two-input logical NAND gates 402, 404, 406 and 408 (also referred to herein as "two-input NAND gates" or simply as "NAND gates") coupled in a cascade configuration. Each of first through fourth NAND gates 402, 404, 406 and 408 receives a 5V DC (or other voltage) power supply as an operating voltage and is coupled to ground (e.g., non-isolated ground). First through fourth two-input NAND gates 402, 404, 406 and 408 may be included in one integrated circuit chip and receive a single power supply voltage, may be distributed among a plurality of integrated circuit chips, or may be distributed among any number of integrated circuit chips and separate discrete devices (e.g., resistors, capacitors, etc.), in a manner such that control circuit 400 is electrically isolated from high power circuitry of solid state relay 100. The two input gates (or pins) of each two-input NAND gate 402, 404, 406 and 408 are tied together, such that each two-input NAND gate 402, 404, 406 and 408 operates as an inverter and receives the same signal at both of its inputs.

First through fourth two-input NAND gates 402, 404, 406 and 408 are connected in series output to input. First NAND gate 402 receives at both of its inputs master control signal 410. First NAND gate 402 outputs the inverse of master control signal 410 at its output pin as first control signal 412. The output (first control signal 412) of first NAND gate 402 is input to both inputs of second NAND gate 404, which outputs the inverse of first control signal 412 as second control signal 414. The output of second NAND gate 404 (second control signal 414) is input to both inputs of third NAND gate 406, which outputs the inverse of second control signal 414 as third control signal 416. The output of third NAND gate 406 (third control signal 416) is input to both inputs of fourth NAND gate 408, which outputs the inverse of third control signal 416 as fourth control signal 418. Control circuit 400 therefore generates first control signal 412 and third control signal 416 that have a logic level (or a "value") that is opposite a logic level of master control signal 410, and generates second and fourth control signals 414 and 418 that have a same logic level (or "value") as master control signal 410. Thus, first and third control signals 412 and 416 have values that are opposite values of second and fourth control signals 414 and 418 for any given value of master control signal 410 input to control circuit 400.

Figure 5:
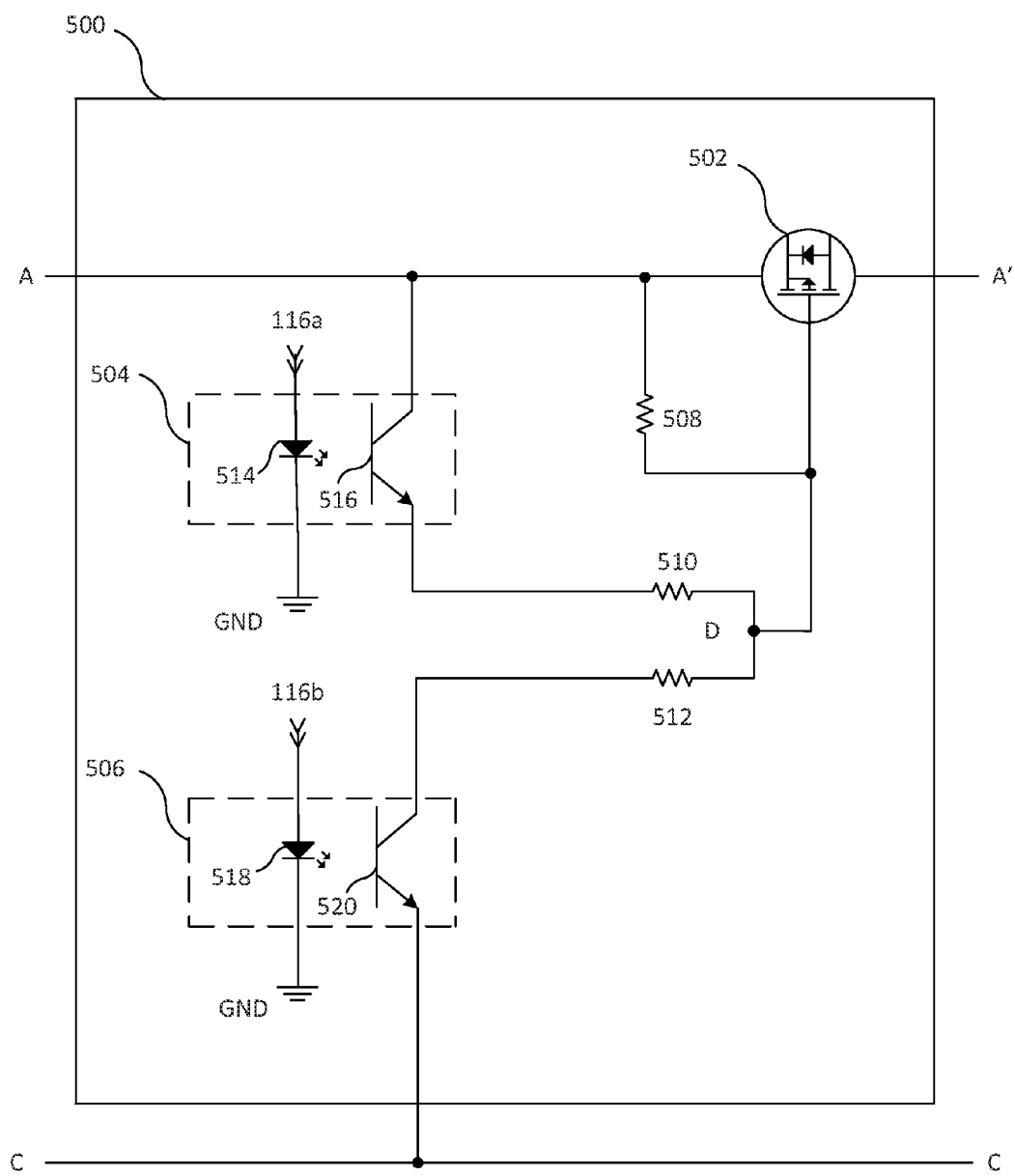
FIG. 5 shows an example of a fast turn-on circuit according to an example embodiment.

Control circuit 400 outputs first and second control signals 412 and 414 to fast turn-off circuit 108 (or 600 of FIG. 6) and outputs third and fourth control signals 416 and 418 to fast turn-on circuit 106 (or 500 of FIG. 5). For any given master control signal 410 input to control circuit 400, first and second control signals 412 and 414 output to fast turn-off circuit 108 of FIG. 1 or fast turn-off circuit 600 of FIG. 6, first and second control signals 412 and 414 will have opposite values with respect to each other. Likewise, for any given master control signal 410 input to control circuit 400, third and fourth control signals 416 and 418 output to fast turn-on circuit 108 of FIG. 1 or fast turn-on circuit 500 of FIG. 5, third and fourth control signals 416 and 418 will have opposite values with respect to each other. Further, when master control signal 410 is toggled to an opposite value in order to perform a fast turn-off of a source power to a load when the source power is being supplied to the load, or to perform a fast turn-on of the source power to the load when the source power is not being supplied to the load, each of first through fourth control signals 412, 414, 416 and 418 output by control circuit 400 is also toggled. Outputs of control circuit 400 for values of master control signal 410 input to control circuit 400 are summarized in logic table Table 1 below.

TABLE 1

| Master Control Signal 410 | First Control Signal 412 | Second Control Signal 414 | Third Control Signal 416 | Fourth Control Signal 418 |
|---|---|---|---|---|
| 1 | 0 | 1 | 0 | 1 |
| 0 | 1 | 0 | 1 | 0 |

Furthermore, it should be noted that in embodiments in which control circuit 104 is configured according to control circuit 400, first and third control signals 412 and 416, which have a same value with respect to each other for a given master control signal 410, may both be referred to as "first control signal 116a". Likewise, second and fourth control signals 414 and 418, which have a same value with respect to each other for a given master control signal 410, may both be referred to as "second control signal 116b". Outputs of control circuit 104 in embodiments in which control circuit 104 is configured similarly to control circuit 400 for values of master control signal 410 input to control circuit 104 are summarized in logic table Table 2 below.

TABLE 2

| Master Control Signal 410 | First Control Signal 116a = First Control Signal 412, Third Control Signal 416 | Second Control Signal 116b = Second Control Signal 414, Fourth Control Signal 418 |
| --- | --- | --- |
| 1 | 0 | 1 |
| 0 | 1 | 0 |

In embodiments in which control circuit 104 is configured according to control circuit 400, fast turn-on circuit 106 is enabled and fast turn-off circuit 108 is disabled when first control signal (116a or 412) is low and second control signal (116b or 414) is high, and fast turn-on circuit 106 is disabled and fast turn-off circuit 108 is enabled when first control signal is high and second control signal is low. Thus, only one of fast turn-on circuit 106 and fast turn-off circuit 108 is enabled at a time.

The solid state relay circuit disclosed herein is configured such that in a case in which all control signals are zero (e.g., the relay circuit is "off"), the relay circuit disconnects power from the load. In addition, when a supply power is initially applied to the solid state relay circuit, such as when first turning the solid state relay circuit on, the master control signal is in a "load off" state until the power supply capacitors 206 and 208 of FIG. 2 are charged by electro-optical power supplies 202 and 204, thereby allowing the load to be switched "on" quickly the first time it is switched on. Thus, in an initial condition, a first value of master control signal 410 is representative of a decision to turn power to the load off. After the capacitors are charged, solid state relay circuit 100 is ready to quickly turn on the load.

Although control circuit 104 has been shown using logical NAND gates to generate first-fourth control signals, it should be understood that first-fourth control signals may be generated using inverters, differently configured logic gates, and/or any number of analog or digital circuits, including microcontrollers and ASICs. Furthermore, fewer numbers of control signals may be generated from master control signal 410 (e.g., just first and second control signals 412 and 414), or additional numbers of control signals may be generated, in embodiments.

Fast Turn-On Circuitry

FIG. 5 shows a fast turn-on circuit 500 according to example embodiments. In some embodiments, fast turn-on circuit 106 of solid state relay 100 shown in FIG. 1 may be implemented in a similar manner as fast turn-on circuit 500 shown in FIG. 5. Note that fast turn-on circuit 500 is provided for purposes of illustration, and is not intended to be limiting. In further embodiments, fast turn-on circuit 106 may be implemented in other ways, as would be known to persons skilled in the relevant art(s). Fast turn-on circuit 500 shown in FIG. 5 is described as follows.

Fast turn-on circuit 500 allows a power switching circuit such as power switching circuit 110 of FIG. 1 to enable a source power to be supplied to a load quickly. Fast turn on circuit 500 shown in FIG. 5 is described herein with respect to elements of solid state relay 100 of FIG. 1. As shown in FIG. 5, fast turn-on circuit 500 includes a p-channel enhancement mode MOSFET (PMOS) 502, first and second opto-isolators 504 and 506, and first-third resistors 508, 510 and 512. PMOS 502 may be a power MOSFET and/or in other embodiments may be other type of transistor or MOSFET other than PMOS. PMOS 502 operates like a switch that can be opened or closed. When closed, PMOS 502 is enabled and fast turn-on circuit operates in an enabled state. When open, PMOS 502 is disabled and fast turn-on circuit operates in a disabled state. When operating in an enabled state, fast turn-on circuit 500 conducts a signal to power switching circuit 110 via PMOS 502 that drives a switch in power switching circuit 110 to enable source power 118 to be supplied to load 112. When operating in a disabled state, fast turn-on circuit 500 does not conduct the enabling signal to power switching circuit 110. PMOS 502 is enabled or disabled by control signals received via first and second opto-isolators 504 and 506. First and second opto-isolators 504 and 506 are described as follows.

First opto-isolator 504 includes a first photodiode 514 and a first phototransistor 516. First photodiode 514 is a light emitting diode. First photodiode 514 is optically coupled to first phototransistor 516. Second opto-isolator 506 includes a second photodiode 518 and a second phototransistor 520. Second photodiode 518 is a light emitting diode. Second photodiode 518 is optically coupled to second phototransistor 520. First opto-isolator receives first control signal 116a from control circuit 104 and second opto-isolator receives second control signal 116b from control circuit 104. First and second control signals 116a and 116b are received at anodes of photodiodes 514 and 518, respectively. The cathodes of photodiodes 514 and 518 are coupled to ground (e.g., non-isolated ground). The optical coupling between first photodiode 514 and first phototransistor 516, and the optical coupling between second photodiode 518 and second phototransistor 520, enables control signals to control fast turn-on circuit 500 while isolating circuitry of fast turn-on circuit 500 from non-isolated power and ground (e.g., 5V DC and GND shown in FIG. 4).

When a control signal received by first photodiode 514 or second photodiode 518 is high, i.e., has a high logic level, the corresponding photodiode converts electrical energy of the control signal into light that is emitted by the photodiode receiving the high level control signal. Phototransistor 516 or 520 receives the light emitted by the respective photodiode. The light excites the receiving phototransistor, which converts the received light back into electrical energy that charges the corresponding phototransistor, enabling that phototransistor to conduct. When the exciting light source (from a photodiode) is removed from an enabled phototransistor, which occurs when a high level control signal is toggled to have a low level, that phototransistor becomes disabled and ceases conducting. As previously described, first and second control signals 116a and 116b have opposite logic levels regardless of each signal's individual level. That is to say, logic levels of first and second control signals 116a and 116b flip simultaneously, so that if one flips, the other also flips and their logic levels remain opposite. Therefore, only one of first phototransistor 516 and second phototransistor 520 receives a high level control signal at a time. In addition, first phototransistor 516 and second phototransistor 520 are similarly driven such that only one of first phototransistor 516 and second phototransistor 520 is enabled at a time.

Whether or not PMOS 502 is enabled or disabled depends on which of first and second phototransistors 516 and 520 is enabled, which in turn depends on values of first and second control signals 116a and 116b output by control circuit 104 as described above. How first and second phototransistors 516 and 520 cause PMOS 502 to be enabled or disabled depends on the topology of fast turn-on circuit 500 (in addition to values of control signals 116*a* and 116*b*), which is described below.

As shown in FIG. 5, PMOS 502 has a source coupled to node A, a drain coupled to node A' and a gate coupled to a node D that is common to first opto-isolator 504 and second opto-isolator 506. First phototransistor 516 of first opto-isolator 504 has a first terminal coupled to node A and a second terminal coupled to node D through resistor 510. Second phototransistor 520 of second opto-isolator 506 has a first terminal coupled to node D through resistor 512 and a second terminal coupled to common node C. As previously noted, first isolated power supply voltage 114*a* from power supply circuit 102 is output at node A, and common node C is at a voltage level of reference voltage VREF, which is a reference voltage of source power 118 of FIG. 1 (also referred to as "reference ground"). When first phototransistor 516 is enabled and second phototransistor 520 is disabled, which occurs when first control signal 116*a* is high and second control signal 116*b* is low, first phototransistor 516 couples the gate of PMOS 502 to node A through resistor 510. When the gate of PMOS 502 is coupled to first isolated power supply voltage 114*a* at node A, gate-source voltage VGS of PMOS 502 is equal to zero, because both the source and gate of PMOS 502 are coupled to node A. Because PMOS 502 is a p-channel enhancement mode MOSFET, a threshold voltage of PMOS 502 is negative. Thus, PMOS 502 is disabled when its VGS is equal to zero, and PMOS 502 does not conduct an enabling signal to power switching circuit 110 (FIG. 1). First phototransistor 516 and resistor 508 maintain PMOS 502 in a disabled state until first and second control signals 116*a* and 116*b* are toggled. Further, resistor 508 maintains PMOS 502 in a disabled state even when there is no power to the control circuit, i.e., when 116*a*=116*b*=0V, or when no power is supplied to power supply circuit 102. When first and second control signals 116*a* and 116*b* are toggled, and first control signal 116*a* becomes low and second control signal 116*b* becomes high, first photodiode 514 turns off, thereby disabling first phototransistor 516 of first opto-isolator 504, and second photodiode 518 turns on, thereby enabling second phototransistor 520 of second opto-isolator 506. When second phototransistor 520 is enabled and first phototransistor 516 is disabled, second phototransistor 520 couples the gate of PMOS 502 to common node C through resistor 512. Reference voltage VREF at common node C applied to the gate of PMOS 502 makes VGS of PMOS 502 negative, thereby enabling PMOS 502. As is described with respect to FIGS. 7A and 7B, when PMOS 502 is enabled, PMOS 502 couples first isolated power supply voltage 114*a* at node A to a gate of a switch in power switching circuit 110 at node A'. When PMOS 502 becomes enabled, PMOS 502 receives at its source a large in-rush of current from charge stored on a plate of first capacitor 206 and drives the current into the gate of the switch in power switching circuit 110 to quickly charge that gate to enable source power 118 to be supplied to load 112 quickly. Thus, PMOS 502 is driven by a low-voltage optically isolated control signal and drives an isolated power supply signal to node A', to quickly charge (turn on) a switch in power switching circuit 110. Hence, fast turn-on circuit 500 is enabled by a low voltage, optically isolated control signal to quickly supply a relatively low-voltage isolated power supply that drives a switch to enable a high-voltage source power to be supplied to a load.

It should be noted that when control circuit 104 is configured according to control circuit 400 of FIG. 4 and is used with fast turn-on circuit 500 in solid state relay 100, fast turn-on circuit 500 receives third control signal 416 at the anode of photodiode 516 instead of first control signal 116*a* and receives fourth control signal 418 at the anode of photodiode 518 instead of second control signal 116*b*. Operation of fast turn-on circuit 500 remains the same as described above regardless of whether fast turn-on circuit 500 receives control signals from control circuit 104 or control circuit 400.

Fast Turn-Off Circuitry

Figure 6:
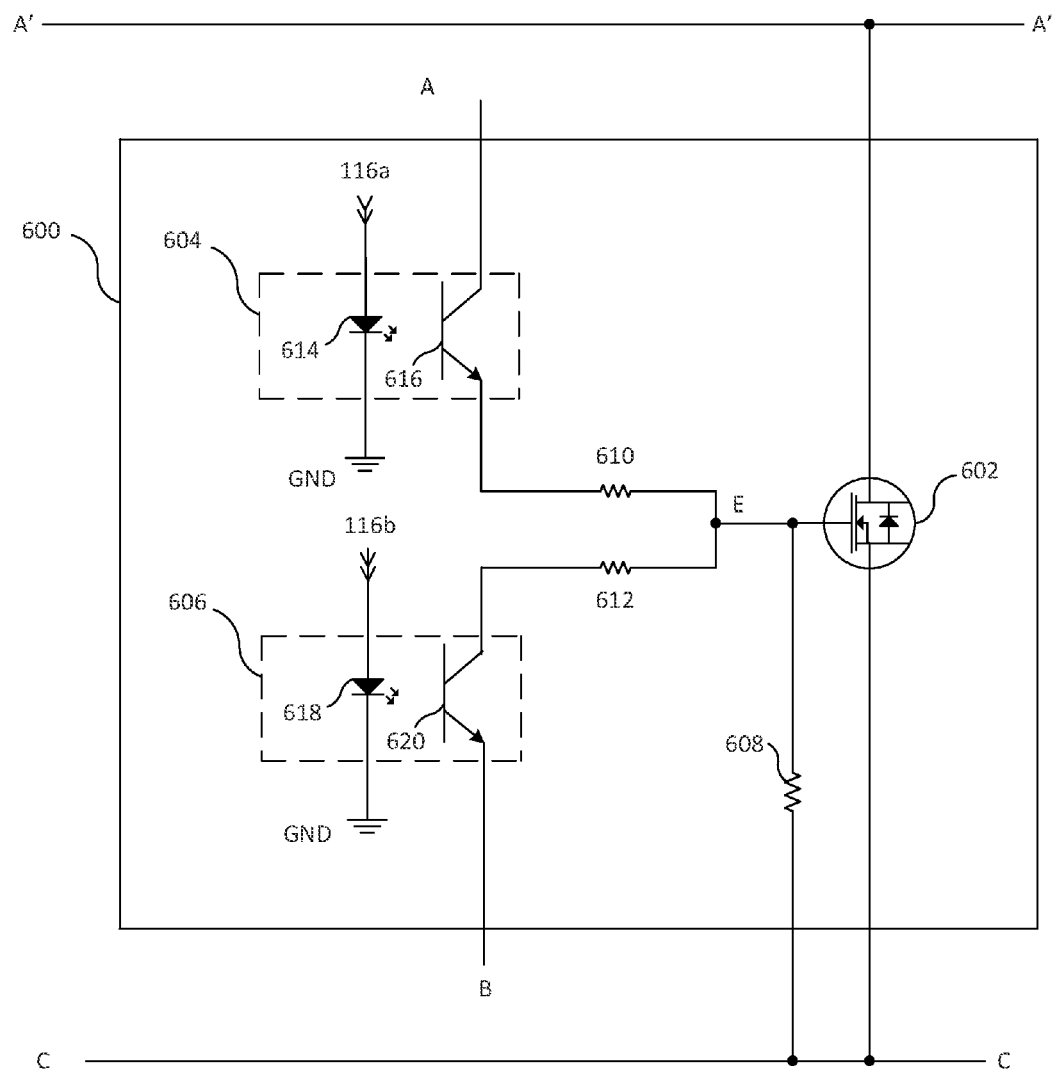
FIG. 6 shows an example of a fast turn-off circuit according to an example embodiment.

FIG. 6 shows a fast turn-off circuit 600, according to example embodiments. In some embodiments, fast turn-off circuit 108 of solid state relay 100 shown in FIG. 1 may be implemented in a similar manner as fast turn-off circuit 600 shown in FIG. 6. Note that fast turn-off circuit 600 is provided for purposes of illustration, and is not intended to be limiting. In further embodiments, fast turn-off circuit 106 may be implemented in other ways, as would be known to persons skilled in the relevant art(s). Fast turn-off circuit 600 shown in FIG. 6 is described as follows.

Fast turn-off circuit 600, when utilized in solid state relay 100, uses an opto-isolator driven power transistor to actively disable a switch in power switching circuit 110, thereby quickly disabling a supply of source power 118 to load 112. Fast turn-off circuit 600 shown in FIG. 6 is described herein with respect to elements of solid state relay 100 of FIG. 1. As shown in FIG. 6, fast turn-off circuit 600 includes an n-channel depletion mode MOSFET (NMOS) 602, third and fourth opto-isolators 604 and 606, and fourth-sixth resistors 608, 610 and 612. In embodiments, NMOS 602 may be a power MOSFET, or may be another type of transistor or MOSFET other than NMOS. NMOS 602 operates like a switch that can be opened or closed. When closed, NMOS 602 is enabled and fast turn-off circuit operates in an enabled state. When open, NMOS 602 is disabled and fast turn-off circuit operates in a disabled state. When operating in an enabled state, fast turn-off circuit 600 actively disables a switch in power switching circuit 110 thereby preventing power switching circuit 110 from supplying source power 118 to load 112. When operating in a disabled state, fast turn-off circuit 600 does not actively prevent power switching circuit 110 from supplying source power to load 112. NMOS 602 is enabled or disabled by control signals received via opto-isolators 604 and 606. Opto-isolators 604 and 606 are described as follows.

Third opto-isolator 604 includes a third photodiode 614 and a third phototransistor 616. Photodiode 614 is a light emitting diode. Third photodiode 614 is optically coupled to third phototransistor 616. Second opto-isolator 606 includes a fourth photodiode 618 and a fourth phototransistor 620. Fourth photodiode 618 is a light emitting diode. Fourth photodiode 618 is optically coupled to fourth phototransistor 620. Third opto-isolator 604 receives first control signal 116*a* from control circuit 104 and fourth opto-isolator 606 receives second control signal 116*b* from control circuit 104. First and second control signals 116*a* and 116*b* are received at anodes of photodiodes 614 and 618, respectively. The cathodes of photodiodes 614 and 618 are coupled to ground (e.g., non-isolated ground). The optical coupling between third photodiode 614 and third phototransistor 616 and the optical coupling between fourth photodiode 618 and fourth phototransistor 620 enables control signals to control fast turn-off circuit 600 while isolating circuitry of fast turn-off circuit 600 from non-isolated power and ground (e.g., 5V DC and GND shown in FIG. 4).

Third and fourth opto-isolators 604 and 606 of fast turn-off circuit 600 operate in the same manner as first and second opto-isolators 504 and 506 of fast turn-on circuit 500 and a detailed description of their operation is not repeated here for purposes of brevity. First and second control signals 116a and 116b are configured such that only one of third phototransistor 616 and fourth phototransistor 620 is enabled at a time. It is important to note that fast turn-on circuit 500 and fast turn-off circuit 600 are configured such that first and second control signals 116a and 116b can only cause one of fast turn-on circuit 500 and fast turn-off circuit 600 to be enabled at a time.

Whether or not NMOS 602 is enabled or disabled depends on which of third and fourth phototransistors 616 and 620 is enabled, which in turn depends on values of first and second control signals 116a and 116b output by control circuit 104 as described above. How third and fourth phototransistors 616 and 620 cause NMOS 602 to be enabled or disabled depends on the topology of fast turn-off circuit 600 (in addition to values of control signals 116a and 116b), which is described below.

As shown in FIG. 6, NMOS 602 has a source coupled to common node C, a drain coupled to node A' and a gate coupled to a node E that is common to third opto-isolator 604 and fourth opto-isolator 606. Third phototransistor 616 of third opto-isolator 604 has a first terminal coupled to node A and a second terminal coupled to node E through resistor 610. Fourth phototransistor 620 of fourth opto-isolator 606 has a first terminal coupled to node E through resistor 612 and a second terminal coupled to node B. As previously noted, second isolated power supply voltage 114b from power supply circuit 102 is output at node B, and common node C is at a voltage level of reference voltage $V_{REF}$, which is a reference voltage (reference ground) of source power 118. When third phototransistor 616 is enabled and fourth phototransistor 620 is disabled, which occurs when first control signal 116a is high and second control signal 116b is low, third phototransistor 616 couples the gate of NMOS 602 to node A through resistor 610. When the gate of NMOS 602 is coupled to first isolated power supply voltage 114a at node A, a gate to source voltage $V_{GS}$ of NMOS 602 becomes greater than zero. Positive $V_{GS}$ applied to n-channel depletion mode MOSFET (NMOS 602) enhances the built-in channel of the n-channel depletion mode MOSFET, thereby increasing an amount of current that can flow through the channel. Thus, positive $V_{GS}$ applied to NMOS 602 enables NMOS 602 to allow a large current at node A' to flow into its drain and out of its source at common node C, thereby rapidly pulling a voltage level at node A' down to a voltage level $V_{REF}$ at common node C. As is described more fully with respect to FIGS. 7A and 7B, by pulling a voltage level at node A' down to a voltage level $V_{REF}$ of common node C, NMOS 602 actively discharges a gate of a switch in power supply circuit 110, which in turn quickly disables power supply circuit 110 from supplying source power 118 to load 112. Further, because NMOS 602 is an n-channel depletion mode MOSFET, current continues to flow through the MOSFET due to the built-in channel of the MOSFET even if $V_{GS}$ becomes zero. Thus, if during a fast turn-off operation for disconnecting a supply of source power 118 to load 112 results in an interruption of isolated power supply voltage 114a, say, for example, due to an event triggering the fast turn-off operation, NMOS 602 holds the voltage at node A' down to that at node C, thereby maintaining the supply of source power 118 to load 112 in an "OFF" state.

In order to reconnect a supply of source power 118 to load 112, a level of a master control signal input to control circuit 104 may be toggled so that first and second control signals 116a and 116b are toggled to disable fast turn-off circuit 600 and enable fast turn-on circuit 500, as described above with reference to FIG. 5. To disable fast turn-off circuit 600 (and enable fast turn-on circuit 500) a level of a master control signal input to control circuit 104 is toggled, causing first and second control signals 116a and 116b to be toggled. When first control signal 116a becomes low and second control signal 116b becomes high, photodiode 614 turns off, thereby disabling third phototransistor 616 of third opto-isolator 604, and photodiode 618 turns on, thereby enabling fourth phototransistor 620 of fourth opto-isolator 606. When fourth phototransistor 620 is enabled (and third phototransistor 616 is disabled), fourth phototransistor 620 couples the gate of NMOS 602 to node B through resistor 612. When the gate of NMOS 602 is coupled to second isolated power supply voltage 114b at node B, a magnitude of $V_{GS}$ of NMOS 602 rapidly increases in the negative direction by negative charge stored on a negative plate of second capacitor 208. As a magnitude of $V_{GS}$ of NMOS 602 rapidly increases in the negative direction, the built-in channel of n-channel depletion mode MOSFET becomes increasingly depleted of charge carriers until the built in channel is completely depleted of charge carriers and current through NMOS 602 becomes zero even if a difference in potential between the drain and source of NMOS 602 $V_{DS}$ exists. Thus, NMOS 602 is rapidly disabled by the application of second control signal 116b having a high level to fourth opto-isolator 606. When NMOS 602 is disabled, NMOS 602 does not allow current at node A' to flow through NMOS 602 to common node C. Further, as noted above, an n-channel depletion mode MOSFET (NMOS) 602 is used so that NMOS 602 remains in a enabled state when no power is supplied to control circuitry 104, i.e., when 116a=116b=0V. In such a case, resistor 608 maintains $V_{GS}$=0V, and thus, NMOS 602 remains in an enabled state.

When control circuit 102 is implemented as control circuit 400 of FIG. 4 and is used with fast turn-off circuit 600 of FIG. 6 in solid state relay 100, fast turn-off circuit 600 receives first control signal 412 at the anode of photodiode 616 instead of first control signal 116a and receives second control signal 414 at the anode of photodiode 618 instead of second control signal 116b. Operation of fast turn-off circuit 600 remains the same as described above regardless of whether fast turn-off circuit 600 receives control signals from control circuit 104 or control circuit 400.

It is noted that first and second isolated power supply voltages 114a and 114b are configured to provide quiescent current necessary to maintain an operating state of PMOS 502 (FIG. 5) and NMOS 602 (FIG. 6) such that an enabled or disabled operating state of fast turn-on circuit 500 and fast turn-off circuit 600 is maintained until such a time as control circuit outputs control signals that are configured to change the operating state of fast turn-on circuit 500 and fast turn-off circuit 600, respectively. First and second isolated power supply voltages 114a and 114b generated by first and second electro-optical power supplies with capacitor storage are further configured to provide surge current necessary to quickly enable and disable power transistors in power switching stage 110 when master control signal input to control circuit 104 or 400 changes level and quiescent current necessary to maintain the state.

Power Switching Circuitry

Figures 7A, 7B:
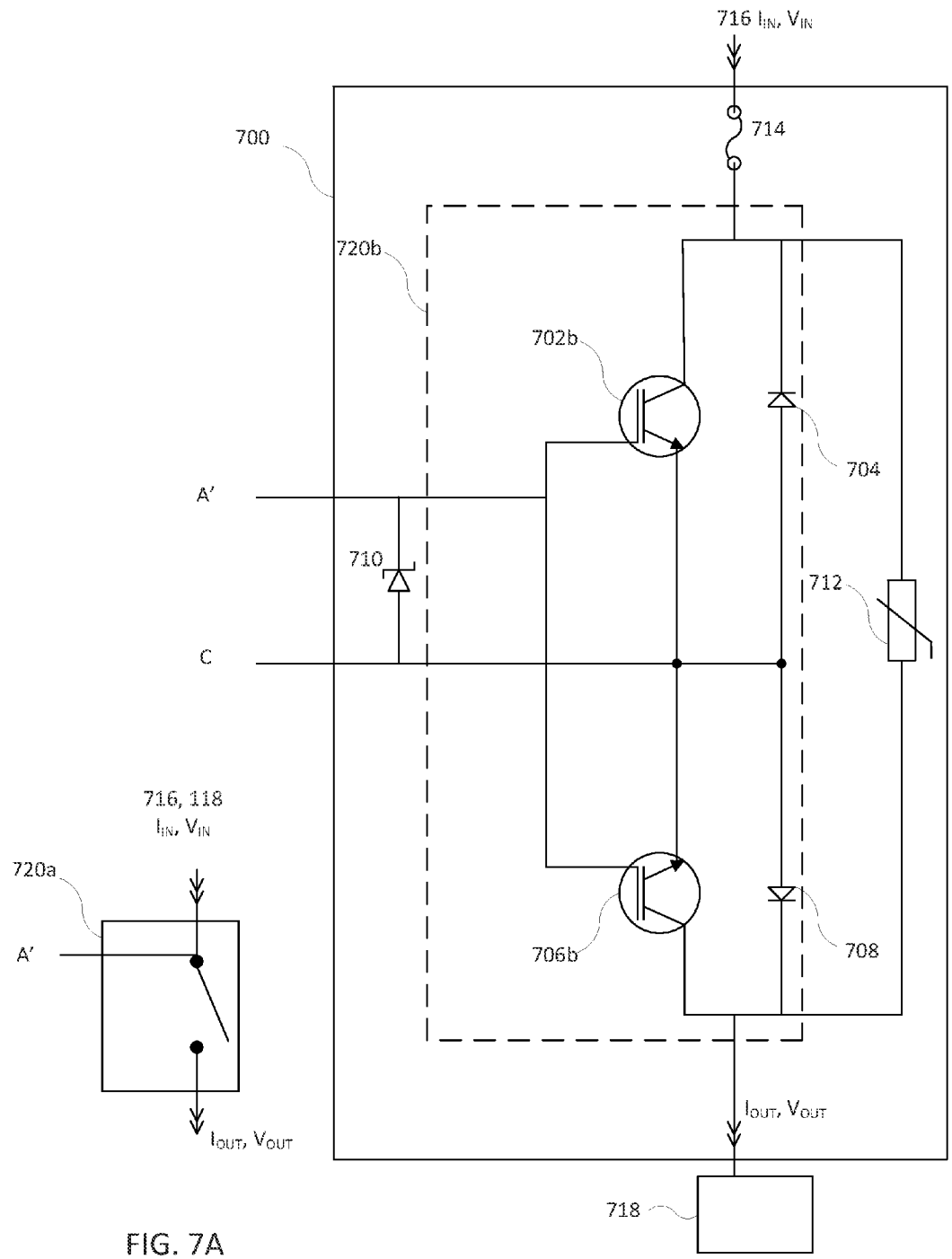
FIGS. 7A-7E show examples of a power switching circuit according to example embodiments.

FIG. 7B shows a power switching circuit 700, according to an example embodiment. In some embodiments, power switching circuit 110 of solid state relay 100 shown in FIG. 1 may be implemented in a similar manner as power switching circuit 700 shown in FIG. 7B. For example, an implementation of power switching circuit 700 may be used in solid state relay 100 in some embodiments in which source power 118 is an AC power supply. Note that power switching circuit 700 is provided for purposes of illustration, and is not intended to be limiting. In further embodiments, power switching circuit

110 may be implemented in other ways, as would be known to persons skilled in the relevant art(s). Power switching circuit 700 shown in FIG. 7B is described as follows.

Because solid state relay 100 does not include inductors or transformers, voltage controlled devices, which can be controlled by low voltage logic level control signals, are used to switch power in power switching circuit 700. MOSFETs and IGBTs are voltage controlled devices that can be controlled by control circuit 104. IGBTs have a high-impedance, voltage driven gate of a MOSFET, a BJT (bipolar junction transistor) collector, and an emitter output able to handle large currents (e.g., 10 A and greater). IGBTs can also support high voltage (e.g., 115V, 240V, 440V) AC loads. Both MOSFETS and IGBTs are capable of switching AC or DC power when two are connected together with anti-parallel diodes. When these devices are in the on-state, MOSFETs will have a voltage drop across their outputs due to their on-resistance; whereas, IGBTs will have a voltage drop characteristic similar to that of a diode. These output characteristics make MOSFETs a better choice for low-voltage, high-current applications or high-voltage, low-current applications. IGBTs have better performance characteristics at high voltages and current. Power switching circuit 700 is shown in FIG. 7B containing a switch 720*b* that is used to switch source power. The embodiment of switch 720*b* shown in FIG. 7B is one example of a switch configuration that may be used, and in further embodiments, other switch configurations may be used in power switching circuit 700 to switch source power. Further examples of configurations for switch 720*b* are shown in FIGS. 7A and 7C-7E as switches 720*a* and 720*c*-720*e*, respectively.

Figure 7C:
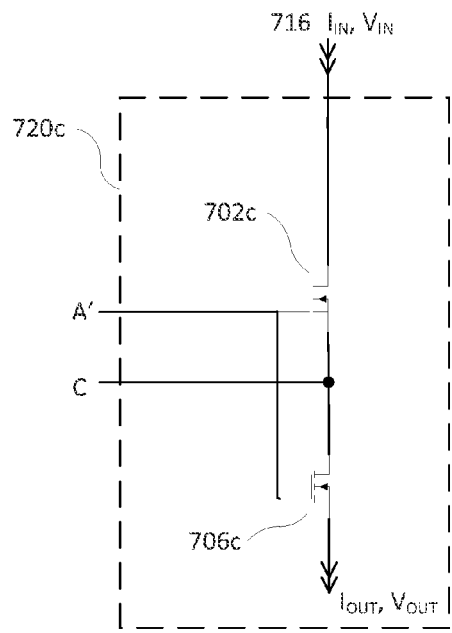
Figure 7D:
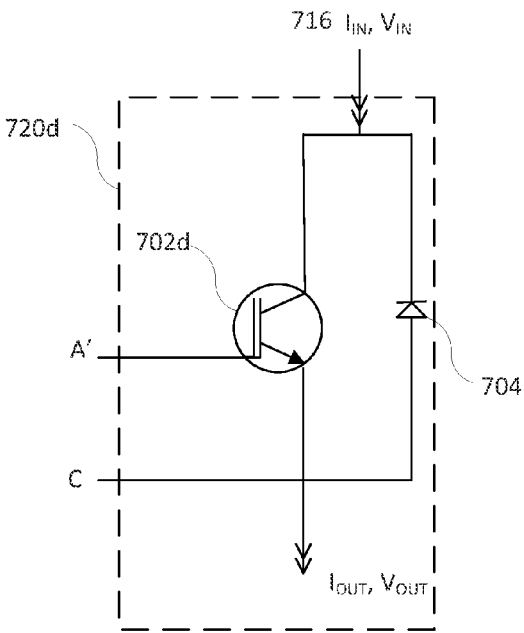
Figure 7E:
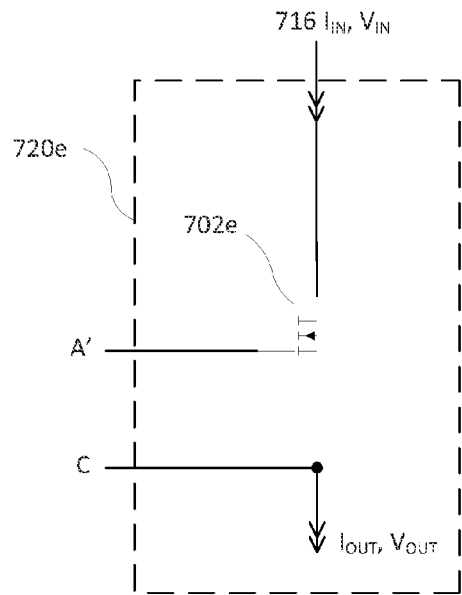

In FIG. 7A, power switching circuit 700 (of FIG. 7B) is shown containing switch 720*a* as a generic switch for switching source power 118. Switch 720*a* may be implemented using one or more n-channel MOSFETS. For instance, as shown in FIG. 7C, N-channel MOSFETs 702*c* and 706*c* can be used as a switch 720*c* for low voltage, high current applications or for high voltage, low current applications. MOSFETS or IGBTs and anti-parallel diodes can be placed in parallel as switch 720*c* with appropriate design considerations to increase the current capability of the system while maintaining the fast switching speed. Effects of large voltage transients can be mitigated by using IGBTs with high voltage ratings in switch 720*c*. For switching a DC power supply, a single IGBT 702*d*/diode 704 pair can be used as switch 720*d*, as shown in FIG. 7D, or, as shown in FIG. 7E, a single MOSFET 702*e* may be used for as switch 720*e* for switching a DC power supply. Any of switches 720*b*-720*e* of FIGS. 7B-7E capable of being controlled by control circuit 104 and that meets necessary power and load requirements can be used in power switching circuit 700 of FIG. 7B to switch source power 118, as would be known to persons skilled in the relevant art(s). IGBTs are voltage controlled and can handle both high voltage and high currents. In some embodiments, a switch may be implemented using two IGBTs (power transistors 702*b* and 706*b*, as shown in FIG. 7B) and anti-parallel diodes in series to allow for switching of an AC or DC power supply.

As shown in FIG. 7B, power switching circuit 700 includes switch 720*b* having a first power transistor 702*b* with an anti-parallel coupled first diode 704 and a second power transistor 706*b* with an anti-parallel coupled second diode 708. Power switching circuit 700 further includes a zener diode 710, a varistor 712 and a fuse 714. Power switching circuit 700 receives an AC power 716. Power switching circuit 700 is configured to be able to enable AC power 716 to be supplied to a load 718 and to disable AC power 716 from being supplied to load 718. Elements of power switching circuit 700 are described as follows.

As shown in the embodiment of FIG. 7A, power transistors 702*b* and 706*b* are insulated gate bipolar transistors (IGBTs). Power transistors 702*b* and 706*b* are connected in series by common emitters between an input of AC power 716 to power switching circuit 700 and an output of AC power 716 from power switching circuit 700 to load 718. Because power transistors 702*b* and 706*b* do not have adequate reverse conduction characteristics, first and second diodes 704 and 708 are placed anti-parallel across the transistors to conduct a reverse current of AC power 716 when the AC signal changes polarity. First and second diodes 704 and 708 prevent power transistors 702*b* and 706*b* from conducting in the reverse direction, which would generate excessive heat in the current application. First and second diodes 704 and 708 also protect transistors 702*b* and 706*b* against reverse voltage spikes by their voltage blocking characteristics and prevent overvoltage in the circuit. Power transistors 702*b* and 706*b* along with anti-parallel coupled diodes 704 and 708 are used to switch AC power 716. Emitters of power transistors 702*b* and 706*b* are coupled to common node C, which is floating at a reference voltage level of AC power 716. Thus, when power switching circuit 700 is used as power switching circuit 110 in FIG. 1, circuit components coupled to common node C are floating at the reference voltage level of AC power 716. Gates of power transistors 702*b* and 706*b* are also coupled together and to node A'. Because gates of power transistors 702*b* and 706*b* control power transistors 702*b* and 706*b*, power transistors 702*b* and 706*b* are simultaneously enabled or disabled by a voltage applied to the gates at node A'. When power transistors 702*b* and 706*b* are enabled by a voltage applied at node A', power transistors conduct a current of AC power 716 to load 718. When power transistors 702*b* and 706*b* are disabled by a voltage applied at node A', power transistors 702*b* and 706*b* prevent a current of AC power 716 from being supplied to load 718.

Varistor (or "variable resistor") 712, when present in embodiments, is a protection device that has an I-V characteristic similar to that of a diode. Thus, varistor 712 has a turn-on voltage at which varistor 712 will begin to conduct. Varistor 712 is coupled between the input of AC power 716 and the output of AC power 716 in a current path through which load 718 can discharge energy back to the AC source. Varistor 712 protects power switching circuit 700, particularly power transistors 702*b* and 706*b*, from transient voltages that are generated when a power supply to load 718 is quickly disabled. For example, if load 718 is inductive, when AC power 716 is quickly disconnected from the inductive load while current is flowing, the fast change in current (di/dt) will cause a large voltage transient from the inductive load as it attempts to dissipate its stored energy. As the current quickly drops to zero, the voltage will quickly rise until varistor 712 turns on. When the transient voltage exceeds the turn-on voltage of varistor 712, varistor 712 conducts and provides a path for load current and voltage to discharge energy back into a source of AC power 716.

Zener diode 710, when present in embodiments, is a diode coupled between gates and emitters of power transistors 702*b* and 706*b* to protect gates of the power transistors 702*b* and 706*b*. Fuse 714, when present in embodiments, is a typical multi-purpose fuse to provide protection from surges in AC power supply 716.

Operation of power switching circuit 700 is described below with respect to fast turn-on circuit 500 and fast turn-off circuit 600. For instance, an operation of power switching circuit 700 when fast turn-on circuit 500 (FIG. 5) is enabled and fast turn-off circuit 600 (FIG. 6) is disabled, which occurs when first control signal 116*a* is low and second control signal 116*b* is high, is described as follows.

When fast turn-on circuit 500 is enabled by second opto-isolator 506 of fast turn-on circuit 500, PMOS 502 receives a large inrush of current at its source from first capacitor 206 of power supply circuit 200. PMOS 502 drives this current into the gates of power transistors 702*b* and 706*b*, which are coupled to the drain of PMOS 502 at node A'. The gates of power transistors 702*b* and 706*b* are quickly charged (turned on) by the rapid inrush of current, and power transistors 702*b* and 706*b* quickly enable a current of AC power 716 to flow to load 718. A quiescent current of first and second isolated power supply voltages 114*a* and 114*b* keeps power transistors 702*b* and 706*b* enabled until master control signal 410 input to control circuit 104 is toggled to perform a fast turn-off operation.

An operation of power switching circuit 700 when fast turn-on circuit 500 is disabled and fast turn-off circuit 600 is enabled, which occurs when first control signal 116*a* is high and second control signal 116*b* is low, is now described as follows.

As previously described with respect to FIG. 6, when n-channel depletion mode MOSFET (NMOS 602) is enabled by opto-isolator 604 the gate of NMOS 602 is coupled to first isolated power supply voltage 114*a* at node A. The turn on voltage of NMOS 602 is negative. Thus, NMOS 602 is enabled at zero volts, small negative voltages and positive voltages. Positive VGS applied to NMOS 602 enhances the built-in channel of the n-channel depletion mode MOSFET, thereby increasing an amount of current that can flow into the drain at node A' and out of the source at node C. Because the gates of power transistors 702*b* and 706*b* are coupled to node A', NMOS 602 (when enabled) effectively couples together node A' and node C, and quickly discharges the gates of power transistors 702*b* and 706*b*. This brings the voltage at node A' and at the gates of power transistors 702*b* and 706*b* down to emitter voltage VREF at common node C, thereby quickly disabling power transistors 702*b* and 706*b* and the supply of AC power 716 to load 718. NMOS 602 holds the gates of power transistors 702*b* and 706*b* at the common emitter voltage even if no voltage is applied to the gate of NMOS 602. Thus, power switching circuit 700 keeps AC power 716 from being supplied to load 718 by n-channel depletion mode MOSFET 602 until master control signal 410 input to control circuit 104 is toggled to perform a fast turn-on operation.

Operational Embodiments

Power may be switched in a variety of ways according to embodiments. For instance, FIGS. 8-14 show flowcharts of methods for performing various switching functions that occur in order to switch a supply of source power to a load, according to example embodiments. Flowcharts of FIGS. 8-14 may be performed by solid state relay 100 shown in FIG. 1, for example. However the methods of flowcharts of FIGS. 8-14 are not limited to that embodiment. For instance, the methods described in flowcharts 800, 900, 1000, 1100, 1200, 1300 and 1400 are largely described with respect to elements shown in FIG. 1. However, it should be noted that the following descriptions also refer to individual elements that may be parts of elements of FIG. 1 in some embodiments, but that have been previously described with respect to elements of FIGS. 2-7, for example. It should be further noted that in the following descriptions, "fast turn-on circuit 106" may be implemented in a similar manner as fast turn-on circuit 500 shown in FIG. 5. "Fast turn-off circuit 108" may be implemented in a similar manner as fast turn-off circuit 600 shown in FIG. 6. "Control circuit 104" may be implemented in a similar manner as control circuit 400 shown in FIG. 4. "Power switching circuit 102" may be implemented in a similar manner as power switching circuit 700 shown in FIG. 7A and may use switch 720*a* shown in FIG. 7A or switch 720*b* shown in FIG. 7B. "Power supply circuit 102" may be implemented in a similar manner as power supply circuit 200 shown in FIGS. 2 and 3. "First and second control signals" may be first and second control signals 116*a* and 116*b*, respectively. "First control signal 116A" may refer to first control signal 412 and third control signal 416 of FIG. 4. "Second control signal 116B" may refer to second control signal 414 and fourth control signal 418. "Source power 118" may be source power 118 of FIG. 1 or source power 716 of FIG. 7A or any other source power that may be input to solid state relay 100 to power a load. "Load 112" may be load 112 of FIG. 1 or load 718 of FIG. 7A or any other load. Load 112 and load 718 may be a resistive load, an inductive load, or any other type of load. The methods of flowcharts of FIGS. 8-14 are not limited to these embodiments. Further structural and operational embodiments is apparent to persons skilled in the relevant art(s) based on the discussion regarding flowcharts of FIGS. 8-14. Flowcharts of FIGS. 8-14 are described as follows.

Figure 8:
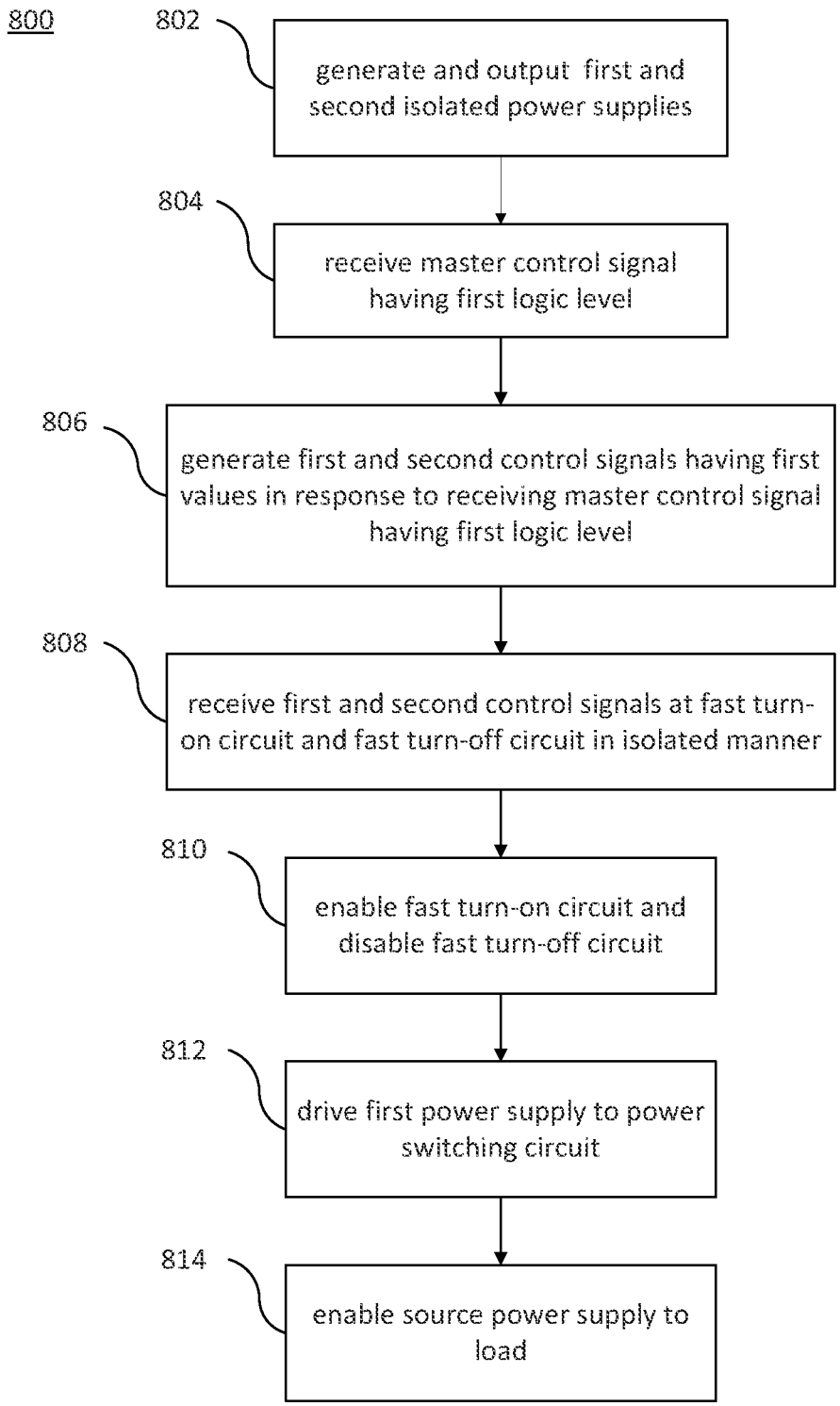
FIG. 8 shows a flowchart for providing a fast turn-on of power to a load, according to an example embodiment.

FIG. 8 shows a flowchart 800 of a method for performing a fast turn-on of a power supply to a load according to an example embodiment. It should be noted that in an initial start-up of solid state relay circuit 100, power to a load is in an off state and capacitors 206 and 208 are charged. Flowchart 800 begins with step 802. In step 802, first and second isolated power supplies are generated and output by power supply circuit 102. For instance, as described above, solid state relay 100 utilizes a low voltage power supply output by power supply circuit 102 and charged capacitors 206 and 208 in order for fast turn-on circuit 106 and fast turn-off circuit 108 to be ready to perform a switching operation. The low voltage should be large enough to create a potential difference between gate and source or emitter terminals of various transistors to fully enable and/or disable those transistors. For example, low voltage power supplies of around ±10V on either side of a reference voltage of a source power to be switched may be used, as well as other voltages. In addition, a source of the low voltage power supplies is electrically isolated from the high voltage switching circuitry (e.g., using optical coupling). Therefore, at step 802, first and second isolated power supply voltages 114*a* and 114*b* having voltages of equal magnitude and opposite polarity with respect to a reference voltage are generated and output at first and second nodes A and B of power supply circuit 102. A method for generating first and second isolated power supplies according to an embodiment is shown further below in flowchart 1400 of FIG. 14.

At step 804, a master control signal having a first logic level is received at control circuit 104 (e.g., a "0" or "1", or a "high" or "low", etc., representing a decision to perform a fast turn-on of source power to a load). The master control signal may be input by flipping a mechanical switch, or by a microcontroller, or by any other means by which a signal may be input to control circuit 104. For instance, as described above, first and second control signals 116*a* and 116*b* are input to fast turn-on circuit 106 and fast turn-off circuit 108 in order to enable and disable those circuits. Control signals 116*a* and 116*b* may be low voltage, logic level signals generated in electrical isolation from high voltage switching circuitry of solid state relay 100, and are received by fast turn-on circuit 106 and fast turn-off circuit 108 in an isolated manner (e.g., optical coupling). First and second control signals 116*a* and 116b are generated in response to a master control signal that represents a decision to quickly connect (perform a fast turn-on of) or quickly disconnect (perform a fast turn-off of) a supply of source power to a load. Thus, in order to perform a fast turn-on of a supply of source power to a load, master control signal 410 received by control circuit 104 at step 804 has a first logic level that represents a decision to perform a fast turn-on of source power to a load.

In response to receiving master control signal 410 having the first logic level, first and second control signals 116a and 116b having first values are generated by control circuit 104 at step 806. As described above, when first and second control signals 116a and 116b have the first values, e.g., when first control signal 116a has a low logic value and second control signal 116b has a high logic value, fast turn-on circuit 106 is enabled and fast turn-off circuit 108 is disabled. Values of first and second control signals are determined by control circuit 104 in response to a logic level of the master control signal input thereto.

At step 808, first and second control signals 116a and 116b having the first values are received by fast turn-on circuit 106 and fast turn-off circuit 108 in an isolated manner. For instance, as described above, first and second control signals 116a and 116b may be input to fast turn-on circuit 106 and fast turn-off circuit 108 using opto-isolators.

At step 810, fast turn-on circuit 106 is enabled and fast turn-off circuit 108 is disabled in response to receiving first and second control signals 116a and 116b having the first values. When fast turn-on circuit 106 is enabled and fast turn-off circuit 108 is disabled, fast turn-on circuit 106 drives first isolated power supply voltage 114a to power switching circuit 110, at step 812. Power switching circuit 110 enables source power 118 to be supplied to load 112 in response to receiving first isolated power supply voltage 114a at step 814.

Figure 9:
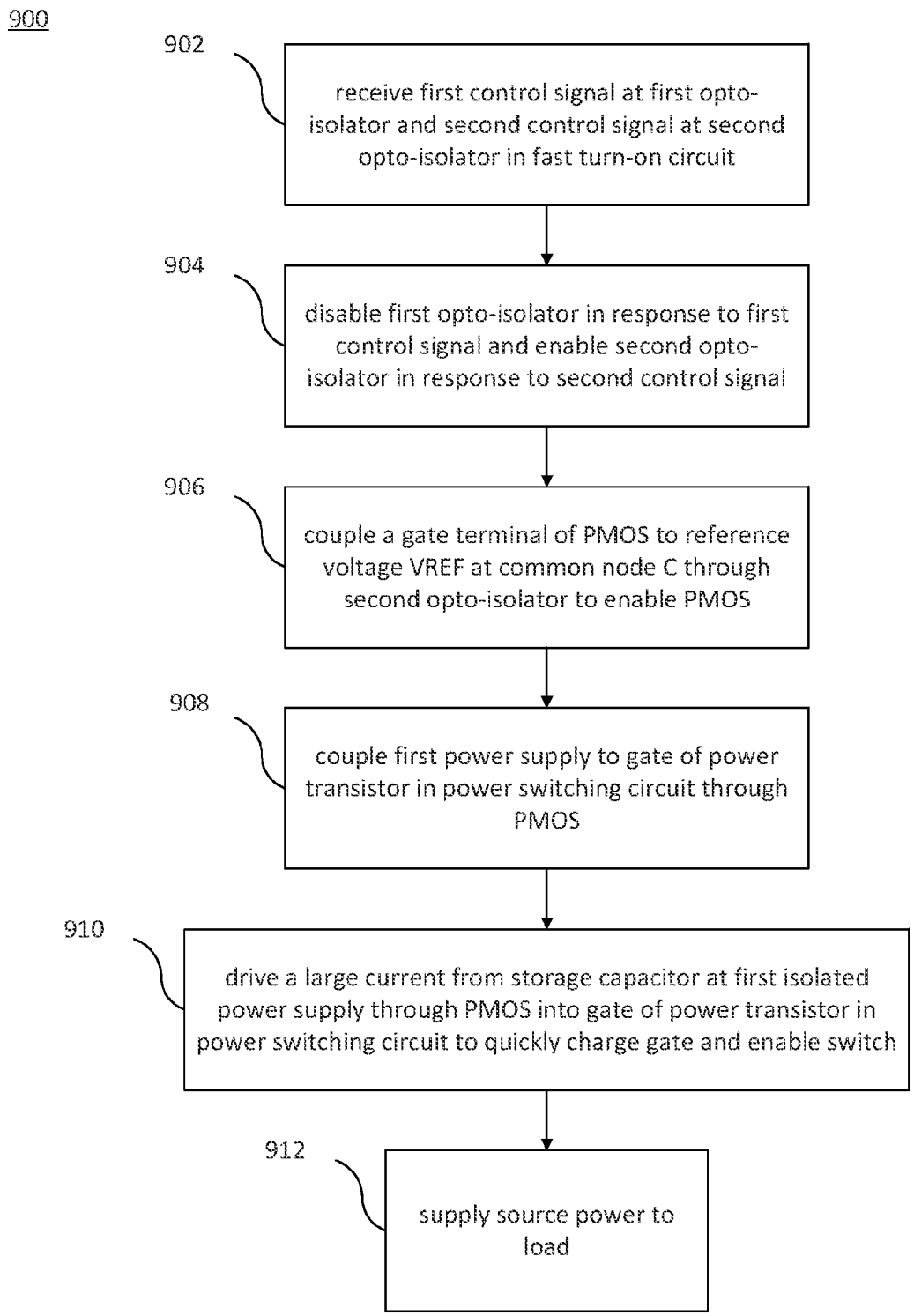
FIG. 9 shows a flowchart for enabling a fast turn-on circuit, according to an example embodiment.

FIG. 9 shows a flowchart 900 of a method for enabling a fast turn-on circuit to drive a power switching circuit to enable source power to be supplied to a load, according to an example embodiment. In flowchart 900, it is assumed that the master control signal having the first logic level for performing a fast turn-on of source power to a load has already been received by control circuit 104, and control circuit 104 has generated first and second control signals 116a and 116b having the first values.

Flowchart 900 begins at step 902, in which fast turn-on circuit 106 receives first control signal 116a at a first opto-isolator 504 and receives second control signal 116b at a second opto-isolator 506. First opto-isolator 504 is disabled in response to receiving first control signal 116a and second opto-isolator 506 is enabled in response to receiving second control signal 116b at step 904. A gate of PMOS 502 is coupled to reference voltage VREF at common node C through second opto-isolator 506 to enable PMOS 502 at step 906. First isolated power supply voltage 114A is coupled to a gate of a switch (e.g., one of switches 720a-720e) in power switching circuit 110 through PMOS 502 at step 908. PMOS 502 receives a large inrush of current from first storage capacitor 206 of power supply circuit 102 when PMOS 502 is enabled, and PMOS 502 drives the large current into the gate of the switch in power switching circuit 110 to quickly charge the gate and enable the switch in step 910. Power switching circuit 110 supplies source power 118 to load 112 in step 912.

Figure 10:
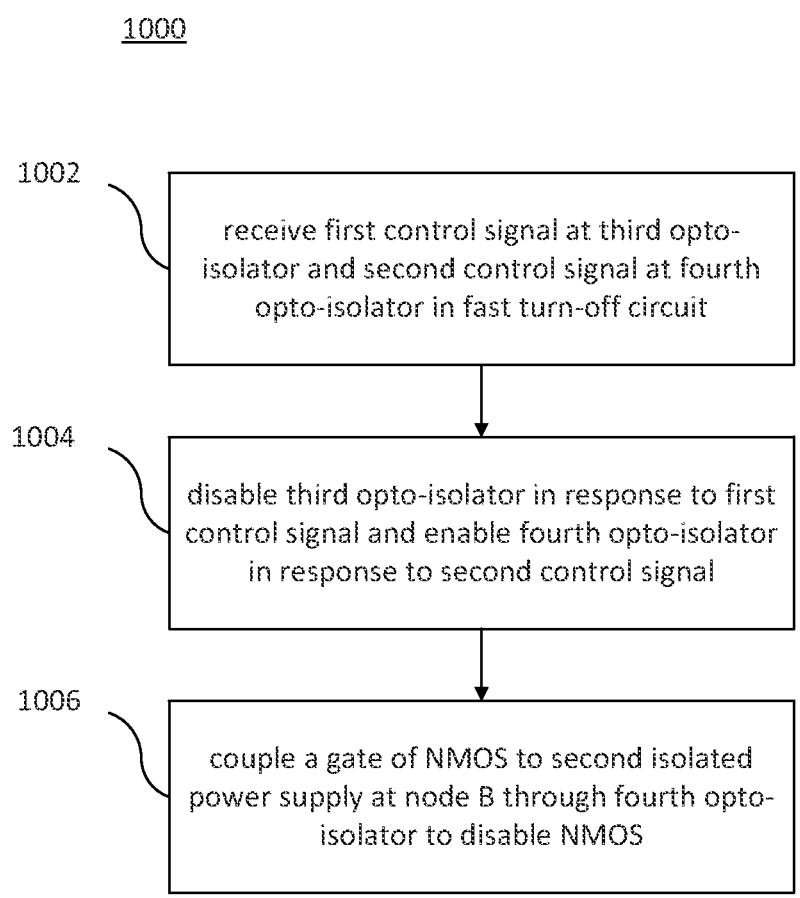
FIG. 10 shows a flowchart for disabling a fast turn-off circuit, according to an example embodiment.

As previously explained, first and second control signals 116a and 116b and fast turn-on circuit 106 and fast turn-off circuit 108 are configured so that only one of fast turn-on circuit 106 and fast turn-off circuit 108 is enabled at a time. Thus, when fast turn-on circuit 106 is enabled to perform a fast turn-on of a source power to a load, fast turn-off circuit 108 is simultaneously disabled. FIG. 10 shows a flowchart 1000 of a method for disabling fast turn-off circuit 108, according to an example embodiment. In flowchart 1000, it is assumed that the master control signal having the first logic level for performing a fast turn-on of source power to a load has already been received by control circuit 104, and control circuit 104 has generated first and second control signals 116a and 116b having the first values.

Flowchart 1000 begins at step 1002. At step 1002 fast turn-off circuit 108 receives first control signal 116a at a third opto-isolator 604 thereof and receives second control signal 116b at a fourth opto-isolator 606 thereof. Third opto-isolator 604 is disabled in response to receiving the first control signal 116a and fourth opto-isolator 606 is enabled in response to receiving second control signal 116b at step 1004. A gate of NMOS 602 is coupled to second isolated power supply voltage 114b at node B through fourth opto-isolator 606 to disable NMOS 602 at step 1006.

Figure 11:
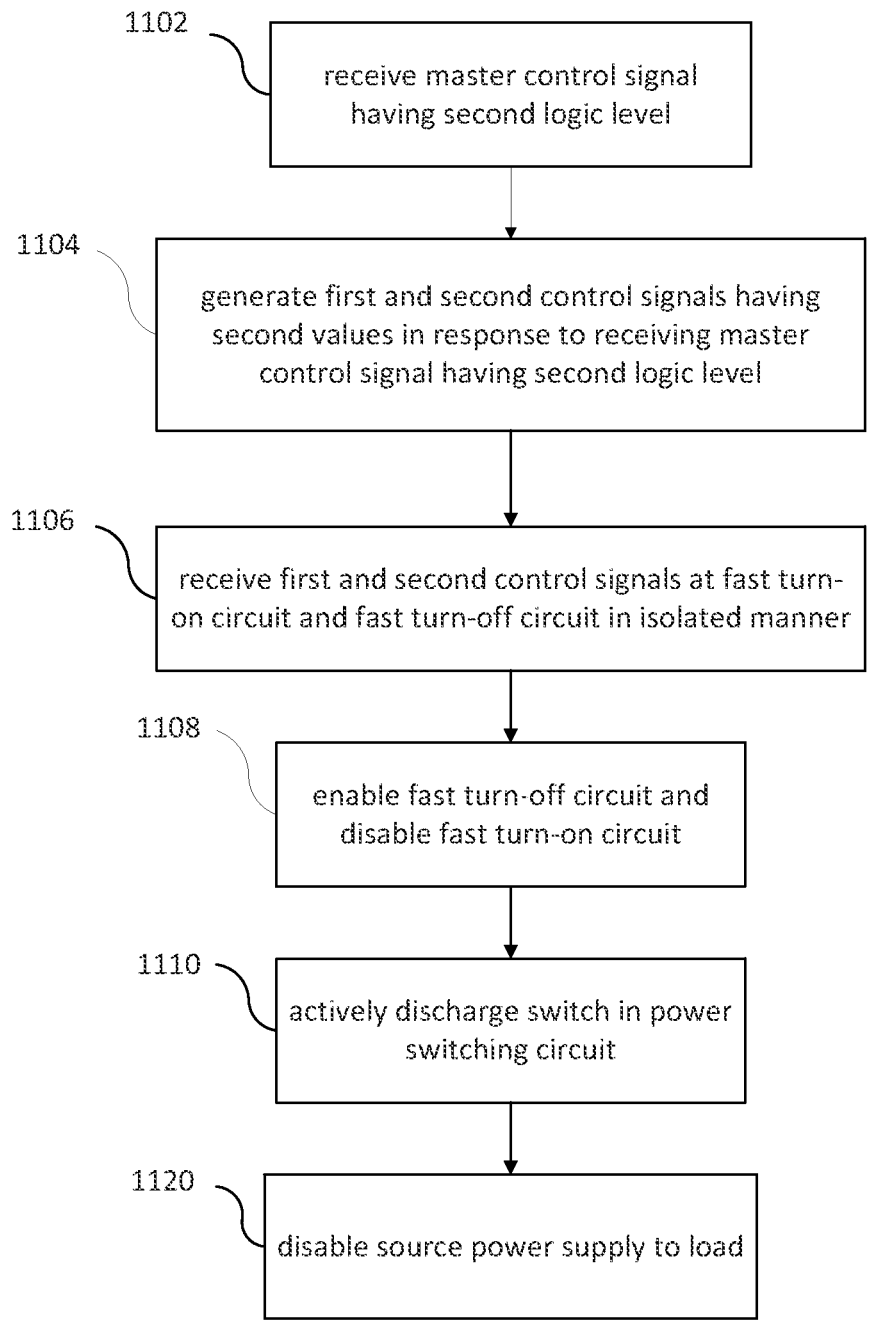
FIG. 11 shows a flowchart for providing a fast turn-off of power to a load, according to an example embodiment.

FIG. 11 shows a flowchart 1100 of a method for performing a fast turn-off of a supply of source power to a load according to an example embodiment. In flowchart 1100, it is assumed that first and second isolated power supplies for operating solid state relay 100 are being provided because a source power is being supplied to a load.

Flowchart 1100 begins at step 1102. In step 1102, a master control signal having a second value that represents a decision to perform a fast turn-off of source power 118 to load 112 is received at control circuit 104. The master control signal may be input by flipping a mechanical switch, or by a microcontroller, or by any other means by which a signal may be input to control circuit 104. In response to receiving the master control signal having the second value, control circuit 104 generates first and second control signals 116a and 116b having second values at step 1104. First and second control signals 116a and 116b having the second values are received by fast turn-on circuit 106 and fast turn-off 108 circuit in an isolated manner at step 1106. At step 1108, fast turn-on circuit 106 is disabled and fast turn-off circuit 108 is enabled in response to receiving first and second control signals 116a and 116b having the second values. When fast turn-on circuit 106 is disabled and fast turn-off circuit 108 is enabled, fast turn-off circuit 108 actively discharges a gate of a switch (e.g., one of switches 720a-720e) in power switching circuit 110 at step 1110. In response to discharging the gate of the switch in power switching circuit 110, source power 118 is quickly disabled from being supplied to load 112 at step 1112.

FIG. 12 shows a flowchart 1200 of a method for enabling fast turn-off circuit 108 to actively disable power switching circuit 110 from supplying a source power to a load, according to an example embodiment. In flowchart 1200, it is assumed that the master control signal having the second logic level for performing a fast turn-off of source power to a load has already been received by control circuit 104, and control circuit 104 has generated first and second control signals 116a and 116b having the second values.

Flowchart 1200 begins at step 1202 in which fast turn-off circuit 108 receives first control signal 116a at a third opto-isolator 604 and receives second control signal 116b at a fourth opto-isolator 606. Third opto-isolator 604 is enabled in response to receiving first control signal 116a and fourth opto-isolator 606 is disabled in response to receiving second control signal 116b at step 1204. A gate of NMOS 602 is coupled to first isolated power supply voltage 114a at node A through third opto-isolator 604 to enable NMOS 602 at step 1206. As previously described, when first isolated power supply voltage 114a is coupled to the gate of NMOS 602, a positive $V_{GS}$ of NMOS 602 induced by application of first isolated power supply voltage to the gate of NMOS 602 enhances the built-in channel of NMOS 602, thereby increasing an amount of current that can flow through NMOS 602. When NMOS 602 is enabled, NMOS 602 couples a gate of the switch in power switching circuit 110 at node A' to an emitter of the switch at common node C, at step 1208. Current flows into a drain of NMOS 602 at node A' and out through its source at common node C, thereby actively discharging the gate of the switch in power switching circuit 110, and disabling the switch at step 1210. Disabling the switch in power switching circuit 110 disables source power 118 from being supplied to load 112 in step 1212. Further, NMOS 602 maintains a supply of source power 118 to load 112 in an "OFF" state at step 1214, even if no voltage is supplied to the gate of NMOS 602 (if $V_{GS}=0$). Thus, if solid state relay 100 is turned off, that is, if power supply circuit 102 stops supplying first and second isolated power supply voltages 114a and 114b, source power 118 to load 112 will remain disabled by NMOS 602. This is because NMOS 602 is an n-channel depletion mode MOSFET, and therefore current continues to flow through NMOS 602 due to the built-in channel even for $V_{GS}=0$. Although effects of coupling a gate of the switch to its emitter are described as occurring in separate steps, it should be noted that steps 1208-1214 occur almost simultaneously because $V_{GS}$ of NMOS 602 is rapidly increased in the positive direction by an injection of current from capacitor 206 when the gate of NMOS 602 is coupled to first isolated power supply voltage 114A.

As previously explained, first and second control signals 116a and 116b and fast turn-on circuit 106 and fast turn-off circuit 108 are configured so that only one of fast turn-on circuit 106 and fast turn-off circuit 108 is enabled at a time. Thus, when fast turn-off circuit 108 is enabled to perform a fast turn-off of a source power to a load, fast turn-on circuit 106 is simultaneously disabled.

Figure 13:
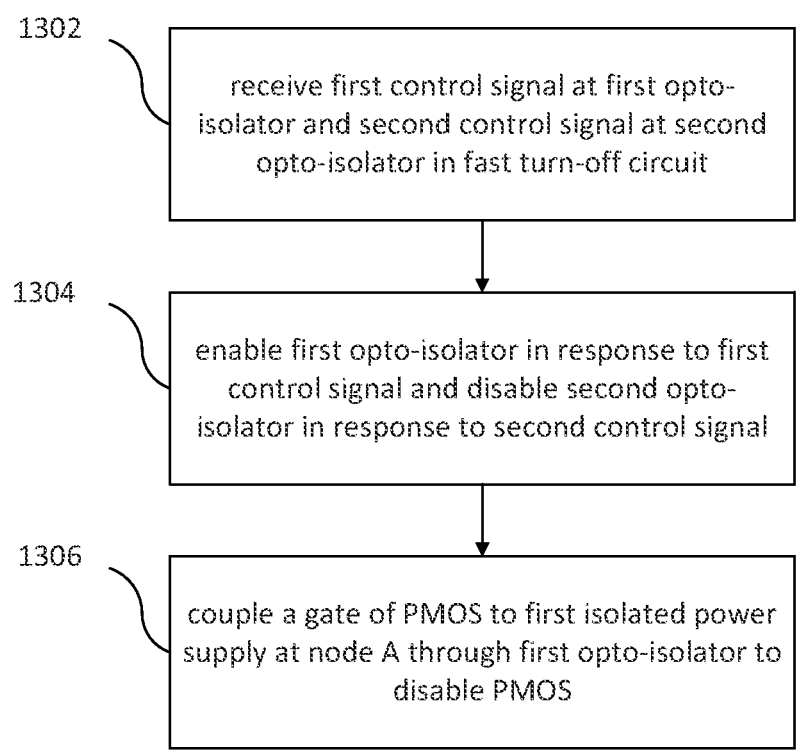
FIG. 13 shows a flowchart for disabling a fast turn-on circuit, according to an example embodiment.

FIG. 13 shows a flowchart 1300 of a method for disabling fast turn-on circuit 106 so that fast turn-on circuit 106 does not drive power switching circuit 110 to enable source power 118 to be supplied to load 112, according to an example embodiment. In flowchart 1300, it is assumed that the master control signal having the second logic level for performing a fast turn-off of source power to a load has already been received by control circuit 104, and control circuit 104 has generated first and second control signals having the second values.

Flowchart 1300 begins at step 1302. In step 1302, first and second control signals having the second values are received at a first opto-isolator 504 and a second opto-isolator 506 of fast turn-on circuit 106, respectively. At step 1304, first opto-isolator 504 is enabled in response to receiving the first control signal and second opto-isolator 506 is disabled in response to receiving the second control signal. A gate of PMOS 502 is coupled to first isolated power supply voltage 114A at node A through first opto-isolator 504 to disable PMOS 502 by making $V_{GS}$ of PMOS 502=0 at step 1306.

Figure 14:
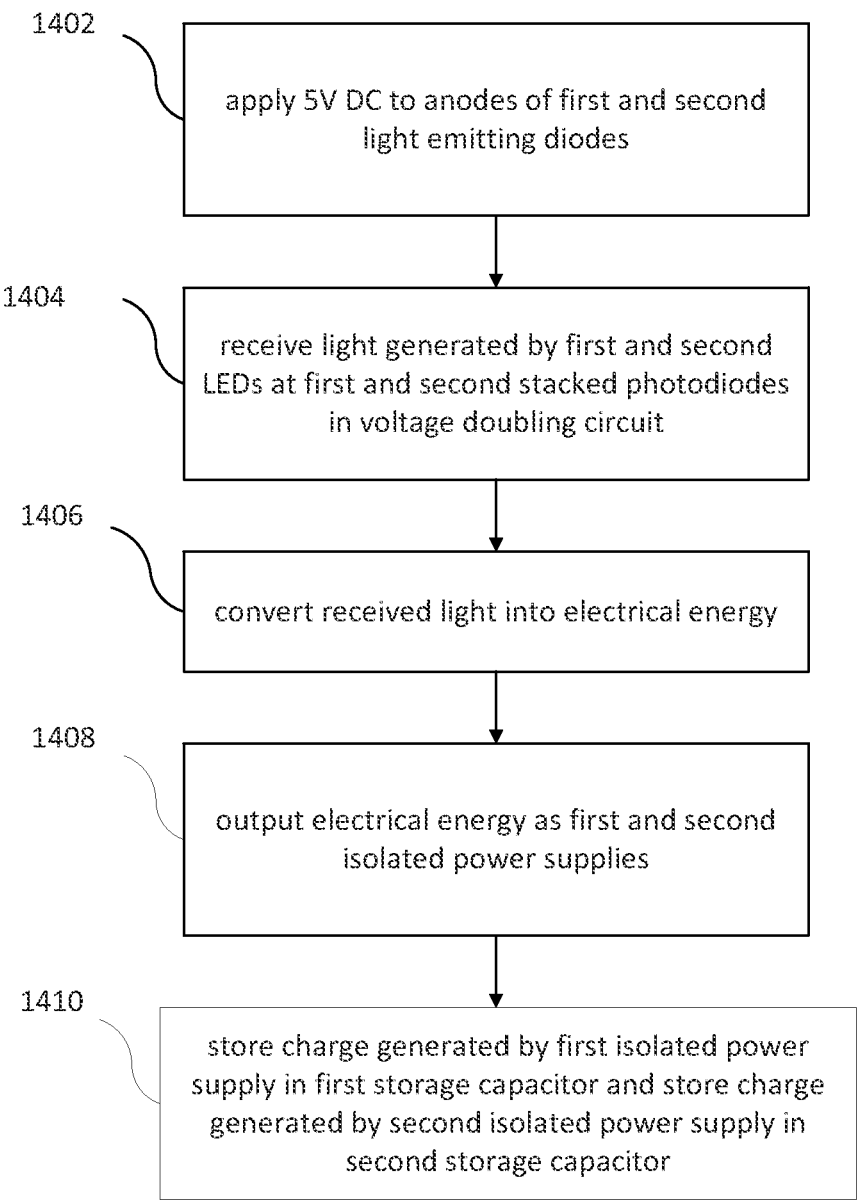
FIG. 14 shows a flowchart for providing isolated power supplies, according to an example embodiment.

FIG. 14 shows a flowchart 1400 of a method for generating first and second isolated power supply voltages 114a and 114b, according to an example embodiment. Flowchart 1400 begins at step 1402. At step 1402, 5V DC power supplies are applied to anodes of LED 302 and LED 310. At step 1404, light generated by LED 302 and LED 310 is received by first and second stacked photodiodes—e.g., first stacked photodiodes 304a-304n and second stacked photodiodes 312a-312n. At step 1406, first and second stacked photodiodes 304a-304n and 312a-312n convert received light into electrical energy, and output the electrical energy as first and second power supply voltages 114a and 114b at first and second nodes A and B of power supply circuit at step 1408. At step 1410, first and second storage capacitors 206 and 208 store charge generated by first and second power supplies.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A solid state relay circuit comprising:
a control circuit that receives a master control signal and generates first and second control signals;
a fast turn-on circuit that receives the first and second control signals in an isolated manner, that operates in an enabled state when the first and second control signals have first values, and that switches to a disabled state when the first and second control signals have second values;
a fast turn-off circuit that receives the first and second control signals in an isolated manner, that operates in a disabled state when the first and second control signals have the first values, and that switches to an enabled state when the first and second control signals have the second values;
a power switching circuit that enables a source power to be supplied to a load when the fast turn-on circuit is in the enabled state and the fast turn-off circuit is in the disabled state, and disables the source power from being supplied to the load when the fast turn-on circuit is in the disabled state and the fast turn-off circuit is in the enabled state; and
a power supply circuit that provides isolated power to the fast turn-on circuit and the fast turn-off circuit and that drives the power switching circuit when the fast turn-on circuit is in the enabled state and the fast turn-off circuit is in the disabled state, the isolated power being disabled from driving the power switching circuit when the fast turn-on circuit is in the disabled state and the fast turn-off circuit is in the enabled state, the power supply circuit comprising:
a first electro-optical power supply that receives an input supply voltage and generates a first isolated power supply voltage having a first voltage level; and
a second electro-optical power supply that receives the input supply voltage and generates a second isolated power supply voltage having a second voltage level that is less than the first voltage level; and
wherein the first electro-optical power supply, the second electro-optical power supply, and the power switching circuit are coupled to a common node that is at a reference voltage between the first voltage level and the second voltage level.

2. The solid state relay circuit of claim 1, wherein the power supply circuit further comprises a first capacitor that stores the first isolated power supply voltage, and wherein, when the first transistor couples the first isolated power supply voltage to the power switching circuit, the first capacitor injects a large current to the power switching circuit to quickly enable the source power to be supplied to the load.

3. The solid state relay circuit of claim 1, wherein the power switching circuit comprises:
   an input terminal coupled to the source power supply; and
   an output terminal coupled to the load;
   wherein, when the fast turn-on circuit is enabled and the fast turn-off circuit is disabled, the input terminal is coupled to the output terminal and the source power is supplied to the load, and when the fast turn-on circuit is disabled and the fast turn-off circuit is enabled, the input terminal is not coupled to the output terminal and the source power is not supplied to the load.

4. The solid state relay circuit of claim 3, wherein the power switching circuit further comprises a gate, and wherein the fast turn-on circuit comprises:
   a first transistor that has a source coupled to the first isolated power supply voltage, a drain coupled to the power switching circuit, and a gate;
   a first opto-isolator coupled between the first isolated power supply voltage and the gate of the first transistor and that receives the first control signal in an isolated manner; and
   a second opto-isolator coupled between the reference node and the gate of the first transistor and that receives the second control signal in an isolated manner, wherein, when the first and second control signals have the first values:
      the first opto-isolator is disabled and the second opto-isolator is enabled to couple the reference voltage to the gate of the first transistor and enable the first transistor, and
      wherein the first transistor couples the first isolated power supply voltage to the gate of the power switching circuit, and the first isolated power supply voltage drives the power switching circuit to supply the source power to the load.

5. The solid state relay circuit of claim 4, wherein, when the first and second control signals have the second values:
   the second opto-isolator is disabled and the first opto-isolator is enabled to couple the first isolated power supply voltage to the gate of the first transistor to disable the first transistor from conducting and switch the fast turn-on circuit to the disabled state.

6. The solid state relay circuit of claim 3, wherein the fast turn-off circuit comprises:
   a second transistor that has a source coupled to the reference voltage, a drain coupled to the power switching circuit, and a second gate;
   a third opto-isolator coupled between the first isolated power supply voltage and the second gate of the second transistor and that receives the first control signal in an isolated manner; and
   a fourth opto-isolator coupled between the second isolated power supply voltage and the second gate of the second transistor and that receives the second control signal in an isolated manner,
   wherein, when the first and second control signals have the first values:
      the third opto-isolator is disabled and the fourth opto-isolator is enabled to couple the second isolated power supply voltage to the second gate of the second transistor so that the second transistor is not conducting and the fast turn-off circuit is in the disabled state.

7. The solid state relay circuit of claim 6, wherein the first and second control signals have the second values:
   the fourth opto-isolator is disabled and the third opto-isolator is enabled to couple the first isolated power supply voltage to the second gate of the second transistor and enable the second transistor, and the second transistor couples the reference voltage to the gate of the power switching circuit when the second transistor is enabled to discharge the gate of the power switching circuit and prevent the power switching circuit from supplying the source power to the load.

8. The solid state relay circuit of claim 3, wherein the power switching circuit further comprises:
   a first power transistor having a first terminal coupled to the input terminal of the power switching circuit, a gate, and a second terminal coupled to the common node; and
   a second power transistor having a first terminal coupled to the common node, a gate, and a second terminal coupled to the output terminal of the power switching circuit;
   wherein the gate of the power switching circuit is a common gate of the first power transistor and the second power transistor.

9. The solid state relay circuit of claim 8, wherein the first power transistor and the second power transistor are insulated gate bipolar transistors (IGBTs), the power switching circuit further comprising:
   a first power diode coupled antiparallel across the first IGBT;
   a second power diode coupled antiparallel across the second IGBT; and
   a varistor coupled to a current return path between the load and the source power.

10. The solid state relay circuit of claim 1, wherein a logic level of the master control signal represents a decision to perform either a fast turn-on of the source power to the load or a fast turn-off of the source power to the load, and the control circuit generates the first and second control signals to have the first values when the logic level of the master control signal represents a decision to perform a fast turn-on of the source power to the load and generates the first and second control signals to have the second values when the logic level of the master control signal represents a decision to perform a fast turn-off of the source power to the load.

11. A solid state relay circuit comprising:
   a control circuit that receives a master control signal and generates first and second control signals;
   a fast turn-on circuit that receives the first and second control signals in an isolated manner, that operates in an enabled state when the first and second control signals have first values, and that switches to a disabled state when the first and second control signals have second values;
   a fast turn-off circuit that receives the first and second control signals in an isolated manner, that operates in a disabled state when the first and second control signals have the first values, and that switches to an enabled state when the first and second control signals have the second values;
   a power switching circuit that enables a source power to be supplied to a load when the fast turn-on circuit is in the enabled state and the fast turn-off circuit is in the disabled state, and disables the source power from being supplied to the load when the fast turn-on circuit is in the disabled state and the fast turn-off circuit is in the enabled state; and
   a power supply circuit that provides isolated power to the fast turn-on circuit and the fast turn-off circuit and that drives the power switching circuit when the fast turn-on circuit is in the enabled state and the fast turn-off circuit is in the disabled state, the isolated power being disabled from driving the power switching circuit when the fast turn-on circuit is in the disabled state and the fast turn-off circuit is in the enabled state;
wherein the fast turn-on circuit comprises:
a first opto-isolator and a second opto-isolator that receive the first and second control signals, respectively; and
a first transistor that has a source coupled to a first isolated power supply voltage, a drain coupled to the power switching circuit, and a gate;
wherein the gate is coupled to a reference voltage through the second opto-isolator when the first and second control signals have the first values, and is coupled to the first isolated power supply voltage through the first opto-isolator when the first and second control signals have the second values;
wherein the first transistor couples the first isolated power supply voltage to the power switching circuit when the gate is coupled to the reference voltage and does not couple the first isolated power supply voltage to the power switching circuit when the gate is coupled to the first isolated power supply voltage; and
wherein the first isolated power supply voltage drives the power switching circuit to enable the source power to be supplied to the load when the first transistor couples the first isolated power supply voltage to the power switching circuit.

12. The solid state relay circuit of claim 11, wherein the fast turn-off circuit comprises:
a third opto-isolator and a fourth opto-isolator that receive the first and second control signals, respectively; and
a second transistor that has a source coupled to the reference voltage, a drain coupled the power switching circuit, and a second gate;
wherein the second gate is coupled to a second isolated power supply voltage through the fourth opto-isolator when the first and second control signals have the first values, and is coupled to the first isolated power supply voltage through the third opto-isolator when the first and second control signals have the second values; and
wherein the second transistor does not conduct when the second gate is coupled to the second isolated power supply voltage, and wherein the second transistor couples the reference voltage to the power switching circuit when the second gate is coupled to the first isolated power supply voltage to disable the power switching circuit from supplying the source power to the load.

13. The solid state relay circuit of claim 12, wherein the second transistor comprises an n-channel depletion mode MOSFET that keeps the power switching circuit from enabling the source power to be supplied to the load when no voltage is applied to the second gate.

14. The solid state relay circuit of claim 12, wherein the power supply circuit further comprises a second capacitor that stores the second isolated power supply voltage, and wherein, when the second gate of the second transistor is coupled to the second isolated power supply voltage, the second capacitor injects a large current to the second gate of the second transistor to quickly disable the second transistor from conducting.

15. A method for performing a fast turn-on of a source power to a load, comprising:
generating a first isolated power supply voltage; generating a second isolated power supply voltage, wherein the first isolated power supply voltage is higher than a reference voltage and the second isolated power supply voltage is lower than the reference voltage;
generating first and second control signals having first values;

receiving, in an isolated manner, the first control signal at a first opto-isolator of the fast turn-on circuit and at a third opto-isolator of the fast turn-off circuit; and
receiving, in an isolated manner, the second control signal at a second opto-isolator of the fast turn-on circuit and at a fourth opto-isolator of the fast turn-off circuit;
enabling the fast turn-on circuit and disabling the fast turn-off circuit in response to receiving the first and second control signals having the first values, said enabling the fast turn-on circuit and disabling the fast turn-off circuit comprising:
disabling the first and third opto-isolators in response to receiving the first control signal;
enabling the second and fourth opto-isolators in response to receiving the second control signal;
coupling a gate of a first transistor of the fast turn-on circuit to the reference voltage through the second opto-isolator to enable the first transistor in response to the second opto-isolator being enabled and the first opto-isolator being disabled; and
coupling a gate of a second transistor of the fast turn-off circuit to the second isolated power supply voltage through the fourth opto-isolator to disable the second transistor in response to the fourth opto-isolator being enabled and the third opto-isolator being disabled;
driving the first isolated power supply voltage to a gate of a switch to enable the switch in response to the fast turn-on circuit being enabled and the fast turn-off circuit being disabled; and
supplying the source power to the load in response to the switch being enabled; and
a control circuit that receives a master control signal and generates the first control signal and the second control signal.

16. The method of claim 15, wherein said driving the first isolated power supply voltage to a gate of a switch to enable the switch in response to the fast turn-on circuit being enabled and the fast turn-off circuit being disabled comprises:
storing a charge of the first isolated power supply voltage in a first storage capacitor;
coupling the gate of the switch to a positively charged plate of the first storage capacitor through the first transistor of the fast turn-on circuit in response to the first transistor being enabled and the second transistor being disabled; and
driving a current from the first storage capacitor into the gate of the switch in response to coupling the gate of the switch to the first storage capacitor through the first transistor; and
wherein said supplying the source power to the load in response to the switch being enabled comprises:
coupling the source power to the load through the switch in response to the switch being enabled.

17. A method for performing a fast turn-off of a source power to a load, comprising:
generating first and second control signals having second values;
receiving, in an isolated manner, the first control signal at a first opto-isolator of the fast turn-on circuit and at a third opto-isolator of the fast turn-off circuit; and
receiving, in an isolated manner, the second control signal at a second opto-isolator of the fast turn-on circuit and at a fourth opto-isolator of the fast turn-off circuit;
enabling the fast turn-off circuit and disabling the fast turn-on circuit in response to receiving the first and second control signals having the second values, said enabling the fast turn-off circuit comprising:

enabling the first and third opto-isolators in response to receiving the first control signal;

disabling the second and fourth opto-isolators in response to receiving the second control signal;

coupling a gate of a first transistor of the fast turn-on circuit to the first isolated power supply voltage through the first opto-isolator to disable the first transistor in response to the first opto-isolator being enabled and the second opto-isolator being disabled; and coupling a gate of a second transistor of the fast turn-off circuit to the first isolated power supply voltage through the third opto-isolator to enable the second transistor in response to the third opto-isolator being enabled and the fourth opto-isolator being disabled;

discharging a gate of a switch to disable the switch in response to the fast turn-off circuit being enabled and the fast turn-on circuit being disabled; and disconnecting the source power to the load in response to the switch being disabled.

18. The method of claim 17, wherein the first isolated power supply voltage is higher than a reference voltage; and wherein said discharging comprises:

coupling the gate of the switch to the reference voltage through the second transistor of the fast turn-off circuit in response to the second transistor being enabled and the first transistor being disabled; and discharging the gate of the switch through the second transistor in response to coupling the gate of the switch to the reference voltage.

19. The method of claim 17, further comprising generating a second isolated power supply voltage that is lower than the reference voltage; and wherein the first isolated power supply voltage provides operating power for the fast turn-off circuit when the fast turn-off circuit is operating in an enabled state, and the second isolated power supply voltage provides operating power for the fast turn-off circuit when the fast turn-off circuit is operating in a disabled state.

* * * * *